United States Patent
Teshima et al.

(10) Patent No.: US 6,800,950 B2
(45) Date of Patent: Oct. 5, 2004

(54) MICROSTRUCTURE ARRAY, MOLD FOR FORMING A MICROSTRUCTURE ARRAY, AND METHOD OF FABRICATING THE SAME

(75) Inventors: Takayuki Teshima, Kanagawa (JP); Takashi Ushijima, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/232,328

(22) Filed: Sep. 3, 2002

(65) Prior Publication Data

US 2003/0003728 A1 Jan. 2, 2003

Related U.S. Application Data

(62) Division of application No. 09/949,772, filed on Sep. 12, 2001, now Pat. No. 6,506,623.

(30) Foreign Application Priority Data

Sep. 28, 2000 (JP) ........................................ 2000-295777
Oct. 5, 2000 (JP) ........................................ 2000-305580

(51) Int. Cl.[7] .......................................... H01L 23/544
(52) U.S. Cl. .............................. 257/797; 257/E21.175; 257/E23.179; 349/158
(58) Field of Search ........................ 257/797, E21.175, 257/E23.179; 438/66, 71, 73; 349/158

(56) References Cited

U.S. PATENT DOCUMENTS

| | | | |
|---|---|---|---|
| 5,771,085 A | 6/1998 | Ochi et al. | |
| 6,300,018 B1 * | 10/2001 | Dilley et al. | 430/5 |
| 6,335,522 B1 | 1/2002 | Shimada et al. | |
| 6,436,265 B1 | 8/2002 | Shimada et al. | |

FOREIGN PATENT DOCUMENTS

| | | |
|---|---|---|
| JP | 64-10169 | 2/1989 |
| JP | 01-261601 | 10/1989 |
| JP | 05-303009 | 11/1993 |
| JP | 08-136704 | 5/1996 |
| JP | 09-189901 | 7/1997 |

OTHER PUBLICATIONS

Oikawa, et al., "A Distributed–Index Planar Micro–Lens Made of Plastic," Japanese Journal of Applied Physics, vol. 20, No. 1, pp. L51–L54 (1981).

Daly, et al., "The Manufacture of Microlenses by Melting Photoresist," IOP Short Meetings Series, No. 30, pp. 23–34 (1991).

* cited by examiner

*Primary Examiner*—Alexander Ghyka
(74) *Attorney, Agent, or Firm*—Fitzpatrick, Cella, Harper & Scinto

(57) ABSTRACT

In a fabrication method of a microstructure array, such as a mold for forming a microlens array, a first insulating mask layer is formed on a conductive portion of s substrate, an array of openings for the microstructure array and at least an opening for an alignment marker are formed in the first insulating mask layer during a common process to expose the conductive portion of the substrate at the openings, and first plated or electrodeposited layers are grown in the openings and on the first insulating mask layer using the conductive portion of the substrate as a cathode. The opening for the alignment marker is surrounded by the array of openings for the microstructure array, and a pattern of the opening for the alignment marker is determined such that a current density distribution at the time of electroplating or electrodeposition can be oppressed.

14 Claims, 30 Drawing Sheets

MICROSTRUCTURE ARRAY, MOLD FOR FORMING A MICROSTRUCTURE ARRAY, AND METHOD OF FABRICATING THE SAME

This application is a division of application Ser. No. 09/949,772, filed Sep. 12, 2001 now U.S. Pat. No. 6,506,623.

BACKGROUND OF THE INVENTION

1. Field of the Invention

This invention relates to a microstructure array, such as a microlens array that is usable in fields of optoelectronics and the like, a mold or a master of a mold (in the specification the term "mold" is chiefly used in a broad sense including both a mold and a master of a mold) for forming a microstructure array, a fabrication method of the microstructure array, and so forth.

2. Description of the Related Background Art

A microlens array typically has a structure of arrayed minute lenses each having a diameter from about 2 to 3 microns to about 200 or 300 microns and an approximately semispherical profile. The microlens array is usable in a variety of applications, such as liquid-crystal display devices, light receivers and inter-fiber connections in optical communication systems.

Meanwhile, earnest developments have been made with respect to a surface emitting laser and the like which can be readily arranged in an array form at narrow pitches between the devices. Accordingly, there exists a significant need for a microlens array with narrow lens intervals and a large numerical aperture (NA).

Likewise, a light receiving device, such as a charge coupled device (CCD), has been more and more downsized as semiconductor processing techniques develop and advance. Therefore, also in this field, the need for a microlens array with narrow lens intervals and a large NA is increasing. In the field of such a microlens, a desirable structure is a microlens with a large light-condensing efficiency which can highly efficiently utilize light incident on its lens surface.

Further, similar desires exist in prospective fields of optical information processing, such as optical parallel processing-operations and optical interconnections.

Furthermore, display devices of active or self-radiating types, such as electroluminescent (EL) panels, have been enthusiastically studied and developed, and a highly-defined and highly-luminous display has been thus proposed. In such a display, there is a heightened desire for a microlens array which can be produced at a relatively low cost and with a large area as well as with a small lens size and a large NA.

In addition to the above, in a microlens array to be mounted in a liquid crystal projector and the like, an alignment marker for achieving a precise positional alignment between the microlens array and a driver substrate is needed to prevent a decrease in a light-condensing efficiency due to the deviation between the microlens and a pixel and obtain a bright picture image.

There are presently a number of prior art methods for fabricating microlenses. In a prior art microlens-array fabrication method using an ion exchange method (see M. Oikawa, et al., Jpn. J. Appl. Phys. 20(1) L51–54, 1981), a refractive index is raised at plural places in a substrate of multi-component glass by using an ion exchange method. A plurality of lenses are thus formed at high-refractive index places. In this method, however, the lens diameter cannot be large, compared with intervals between lenses. Hence, it is difficult to design a lens with a large NA. Further, the fabrication of a large-area microlens array is not easy since a large scale manufacturing apparatus, such as an ion diffusion apparatus, is required to produce such a microlens array. Moreover, an ion exchange process is needed for each glass, in contrast with a molding method using a mold. Therefore, variations of lens quality, such as a focal length, are likely to increase between lots unless the management of fabrication conditions in the manufacturing apparatus is carefully conducted. In addition to the above, the cost of this method is relatively high, as compared with the method using a mold.

Further, in the ion exchange method, alkaline ions for ion-exchange are indispensable in a glass substrate, and therefore, the material of the substrate is limited to alkaline glass. The alkaline glass is, however, unfit for a semiconductor-based device which needs to be free of alkaline ions. Furthermore, since a thermal expansion coefficient of the glass substrate greatly differs from that of a substrate of a light radiating or receiving device, misalignment between the microlens array and the devices is likely to occur due to a misfit between their thermal expansion coefficients as an integration density of the devices increases.

Moreover, a compressive strain inherently remains on the glass surface which is processed by the ion exchange method. Accordingly, the glass tends to warp, and hence, a difficulty in joining or bonding between the glass and the light radiating or receiving device increases as the size of the microlens array increases.

In another prior art microlens-array fabrication method using a resist reflow (or melting) method (see D. Daly, et al., Proc. Microlens Arrays Teddington., p23–34, 1991), resin formed on a substrate is cylindrically patterned using a photolithography process and a microlens array is fabricated by heating and reflowing the resin. Lenses having various shapes can be fabricated at a low cost by this resist reflow method. Further, this method has no problems of thermal expansion coefficient, warp and so forth, in contrast with the ion exchange method.

In the resist reflow method, however, the profile of the microlens is strongly dependent on the thickness of resin, wetting condition between the substrate and resin, and heating temperature. Therefore, variations between lots are likely to occur while a fabrication reproducibility per a single substrate surface is high.

In another prior art method, an original plate of a microlens is fabricated, lens material is deposited on the original plate and the deposited lens material is then separated. The original plate or mold is fabricated by an electron-beam lithography method (see Japanese Patent Application Laid-Open No. 1(1989) 261601), or a wet etching method (see Japanese Patent Application Laid-Open No. 5(1993)-303009). In these methods, the microlens can be reproduced by molding, variations between lots are unlikely to occur, and the microlens can be fabricated at a low cost. Further, the problems of alignment error and warp due to the difference in the thermal expansion coefficient can be solved, in contrast with the ion exchange method. In the electron-beam lithography method, however, an electron-beam lithographic apparatus is expensive and a large investment in equipment is needed. Further, it is difficult to fabricate a mold having a large area more than 100 cm$^2$ (10 cm-square) because the electron beam impact area is limited.

In yet another prior art method, a mask layer with serially or two-dimensionally arranged openings is formed on a mother substrate, and etching is performed through the openings (see Japanese Patent Application Laid-Open No. 8(1996)-136704). In the method, however, since the etching is conducted through the resist opening, the bottom of a dug portion inevitably becomes flat and it is hence difficult to condense light into an area less than the opening. Further, in a wet etching method, since an isotropic etching using a chemical action is principally employed, formation of the mother substrate into a desired profile cannot be achieved if composition and crystalline structure of the mother substrate vary even slightly.

As a method that solves the above problems, there has been proposed a method in which an array of semispherical structures is formed by electroplating, a mold for a microlens array is then fabricated using the array as a master, and the microlens array is fabricated using the mold (see Japanese Patent Publication No. 64(1989)-10169). In the method, the size of a structure can be enlarged, a fabrication process is easy, controllability is high, and a mold for a microlens array can be fabricated at relatively inexpensive costs. Further, a microlens with a small radius of curvature can be fabricated by electroplating.

As a method of forming an alignment marker, there has been proposed a method in which a pattern for microlenses and a pattern for the alignment marker are formed during the same process when a resist pattern is formed (see Japanese Patent Application Laid-Open No. 9(1997)-189901).

However, where patterns for microlenses and the alignment marker are formed during the same process and electroplating is then conducted (a combination of methods of Japanese Patent Application Laid Open No. 9(1997)-189901 and Japanese Patent Publication No. 64(1989)-10169), an uneven distribution of a current density is likely to appear due to the pattern shape of the alignment marker, and an electric field is thickened and a growth of electroplating is too strongly promoted at the periphery of the array pattern. Thus, the size of the semispherical structure becomes uneven.

SUMMARY OF THE INVENTION

It is an object of the present invention to provide a fabrication method of flexibly and readily fabricating a microstructure array which is provided with an alignment marker for achieving a precise alignment, a size distribution of which can be reduced, and a radius of curvature of which can be decreased, a fabrication method of a mold for forming a microstructure array (such as a microlens array, a flyeye lens and a lenticular lens) with an alignment marker, a fabrication method of fabricating a microstructure with an alignment marker using the mold, and a microstructure array which is provided with an alignment marker for achieving a precise alignment. More particularly, it is an object to provide a mold for forming a microlens array with an alignment marker, which can be readily increased in size, readily fabricated with good controllability and at a relatively low cost and have a desired radius of curvature, or which has a large NA. It is an additional object to provide a fabrication method of such a mold, and a fabrication method of the microlens array using the mold. In this specification, the term "distribution" is used as a ratio of a difference between a maximum value and an average value relative to the average value concerning a size or radius of plated or electrode posited layers in a certain region. A current density distribution also has a similar meaning.

The present invention is generally directed to a fabrication method of a microstructure array, such as a mold for forming a microlens array, which includes:

(a) a step of preparing a substrate at least a portion of which is electrically conductive;

(b) a step of forming a first insulating mask layer on the conductive portion of the substrate;

(c) a step of forming an array of openings for the microstructure array and at least an opening for an alignment marker in the first insulating mask layer during a common process to expose the conductive portion of the substrate at the openings; and (d) a step of forming first plated or electrodeposited layers in the openings and on the first insulating mask layer using the conductive portion of the substrate as a cathode;

wherein the opening for the alignment marker is surrounded by the array of openings for the microstructure array, and a pattern of the opening for the alignment marker is determined such that a current density distribution at the time of electroplating or electrodeposition in said step (d) can be oppressed.

Specifically, the following constructions can be preferably adopted based on the above fundamental construction.

The shortest distance between the opening for the alignment marker and the opening for the microstructure array is set at no less than the maximum pitch of the array of openings for the microstructure array, and an area ratio of the opening for the alignment marker relative to an area around the opening for the alignment marker surrounded by the array of openings for the microstructure array is set at no more than a half (½).

When such conditions are satisfied, the current density distribution at the time of electroplating or electrodeposition can be preferably oppressed and the size (height, radius, width, and the like) distribution of the plated or electrodeposited layers can be preferably reduced, and hence, a desired entire structure of microstructure array and alignment marker can be formed.

The first insulating mask layer can be removed. It is not always necessary to remove the first mask layer before forming the following second mask layers, especially when the first mask layer is formed of a material, such as PSG (phospho-silicate glass), which can be firmly fixed to the conductive portion of the substrate. In such a case, the first plated or electrodeposited layers can be continuously formed on the first mask layer.

Second insulating mask layers can be formed over a desired area of the first plated or electrodeposited layers formed on the openings for the microstructure array, and over the first plated or electrodeposited layer for the alignment marker, and the first plated or electrodeposited layers not covered with the second insulating mask layer are then removed and the second insulating mask layers are finally removed. Thereby, the size distribution of the microstructure array can be further decreased. The microstructure array obtained at this stage can be used as a final structure.

The second mask layer may be formed of any inorganic or organic insulating material which is anticorrosive to an etchant to be used in the following step. A thin-film forming method, such as a vacuum-evaporating method, a spin-coat method, and a dip method, can be used as a method for forming the second mask layer. The second mask layer can be formed on selected regions by photolithography and etching. A photoresist may be used as a material of the second mask layer. When the photoresist is used, an etching step of the second mask layer material can be omitted.

As discussed above, it is not always necessary to remove the first mask layer before forming the second mask layer, but a fixation of the second mask layer to the substrate can be strengthened when the first mask layer is removed. When the first and second mask layers are both formed of photoresist, this improvement is large.

The exposed first plated layers can be etched by dry etching or wet etching. The following etching gas or etching liquid can be used. This etching gas or etching liquid etches none of the second mask layer, the electrode layer, and the substrate, but selectively etches the exposed first plated layers.

Herein the exposed first plated layers can be electrolytically etched by applying a voltage using those plated layers as an anode. Where the electrode layer is composed of a material that cannot be electrically etched by the electroplating liquid and that cannot produce an alloy layer with the first plated layer, the electrode layer with a flat surface can be regained after the electrolytic etching is performed. In this case, material of the first plated layers removed by the electrolytic etching can be collected in an electroplating bath or on an opposite metal electrode, and therefore, the material of the first plated layers can be reused without waste. Thereby, even when a precious metal is used, fabrication costs can be reduced.

The array of openings for the microstructure array and the openings for the alignment marker formed in the first insulating mask layer can constitute a common array of openings formed in the first insulating mask layer, and in this case the second insulating mask layers are formed over a desired area of the first plated or electrodeposited layers formed on the openings in the common array for the microstructure array, and over at least two first plated or electrodeposited layers formed on the openings in the common array for the alignment marker outside the openings in the common array for the microstructure array. Thereby, the pattern of the alignment marker can be flexibly and readily set according to its application, since the second mask layer for the alignment marker only needs to be formed on a selected region of the first plated or electrodeposited layers formed on the openings in the common array.

A second plated or electrodeposited layer can be preferably formed over the first plated or electrodeposited layers for the microstructure array and the alignment marker. Thereby, the size distribution of the microstructure array can be further reduced, and the first plated or electrodeposited layers can be firmly fixed to the conductive portion or the first mask layer.

The second plated layer can be formed by either electroplating or electroless plating. When the electroless plating is used, a brightened mold for a microstructure array can be obtained. Further, since the electroless plating is an isotropic growth method, radii of curvature of each plated layer can be further equalized in its diagonal and horizontal directions and heights of the plated layers can also be further equalized between areas for the microstructure array and the alignment marker.

A diameter or a shorter width of the opening for the alignment marker is preferably no more than a diameter or a width of the opening for the microstructure array, so that the current density distribution at the time of electroplating or electrodeposition can be preferably oppressed. The opening for the microstructure array may be circular, slit-shaped, elongated stripe-shaped, or the like. A semispherical or semicylindrical microstructure can be formed, for example. The opening for the alignment marker may be circular, annular, square, rectangular, or the like. The pattern of the openings for the alignment marker can take various types of a crisscross pattern, for example. Those are determined according to applications of the microstructure array.

Further, the present invention is generally directed to a microstructure array, such as a mold for forming a microlens array, which includes a substrate at least a portion of which is electrically conductive, a first insulating mask layer formed on the conductive portion of the substrate, an array of first plated or electrodeposited layers formed on the conductive portion of the substrate, and at least a first plated or electrodeposited layer for an alignment marker formed on the conductive portion of the substrate. The first plated or electrodeposited layer for the alignment marker is surrounded by the array of first plated or electrodeposited layers, and the pattern of the first plated or electrodeposited layer for the alignment marker is determined such that a current density distribution at the time of forming the array of first plated or electrodeposited layers and the first plated or electrodeposited layer for the alignment marker by electroplating or electrodeposition can be oppressed.

A first insulating mask layer with an array of openings for the microstructure array and at least an opening for the alignment marker formed on the conductive portion of the substrate may be further provided in the above fundamental structure. Herein, the shortest distance between the opening for the alignment marker and the opening for the microstructure array is set at no less than the maximum pitch of the array of openings for the microstructure array, and an area ratio of the opening for the alignment marker relative to an area around the opening for the alignment marker surrounded by the array of openings for the microstructure array is set at no more than a half (½).

Alternatively, the array of openings for the microstructure array and the openings for the alignment marker formed in the first insulating mask layer can constitute a common array of openings formed in the first insulating mask layer, and in this case the first plated or electrodeposited layers are left only in a desired area of the first plated or electrodeposited layers formed on the openings in the common array for the microstructure array, and in an area of at least two first plated or electrodeposited layers formed on the openings in the common array for the alignment marker outside the openings in the common array for the microstructure array.

In the above fundamental structure, only the first plated or electrodeposited layers in a desired area of the array of first plated or electrodeposited layers and at least a first plated or electrodeposited layer for the alignment marker is preferably left with other first plated or electrodeposited layers being removed A second plated or electrodeposited layer is preferably formed over the first plated or electrodeposited layers for the microstructure array and the alignment marker.

Furthermore, the present invention is generally directed to a microstructure array, such as a mold for forming a microlens array, which includes a substrate at least a portion of which is electrically conductive, a first insulating mask layer formed on the conductive portion of the substrate, an array of first plated or electrodeposited layers formed on the conductive portion of the substrate, at least a first plated or electrodeposited layer for an alignment marker formed on the conductive portion of the substrate, and a second plated or electrodeposited layer formed over the first plated or electrodeposited layers for the microstructure array and the alignment marker. The first plated or electrodeposited layer for the alignment marker is surrounded by the array of first plated or electrodeposited layers, and a pattern of the first plated or electrodeposited layer for the alignment marker is determined such that a current density distribution at the time of forming the array of first plated or electrodeposited layers and the first plated or electrodeposited layer for the alignment marker by electroplating or electrodeposition can be oppressed.

A profile of the first plated or electrodeposited layer of the array of first plated or electrodeposited layers may be different from or the same as a profile of the first plated or electrodeposited layer for the alignment marker.

Also herein, only the first plated or electrodeposited layers in a desired area of the array of first plated or electrodeposited layers and the first plated or electrodeposited layer for the alignment marker are preferably left.

These advantages, as well as others will be more readily understood in connection with the following detailed description of the preferred embodiments of the invention in connection with the drawings.

DESCRIPTION OF THE PREFERRED EMBODIMENTS

A first embodiment of the present invention will be described with reference to FIGS. 1A to 7. In the first embodiment, a silicon wafer with a diameter of four inches is thermally oxidized using an oxidizing gas, and layers of silicon dioxide with a thickness of 1 $\mu$m are formed on opposite surfaces of the wafer. This wafer is used as a substrate 1 illustrated in FIGS. 1A to 1F. Ti and Pt are continuously layered with thicknesses of 50 Å and 500 Å on the above wafer, respectively, using a vacuum sputtering method. An electrode layer 2 is thus formed. A positive photoresist (product name: Az1500 produced by Clariant Com.) is then deposited to form a first insulating mask layer 3.

Figure 1A:
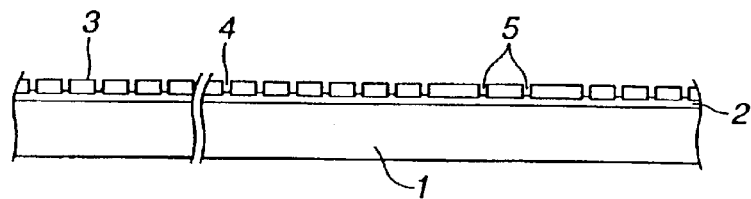
FIGS. 1A to 1F are cross-sectional views illustrating electroplating growth steps in a fabrication method of a mold for forming a microlens array of a first embodiment according to the present invention, respectively.
Figure 2:
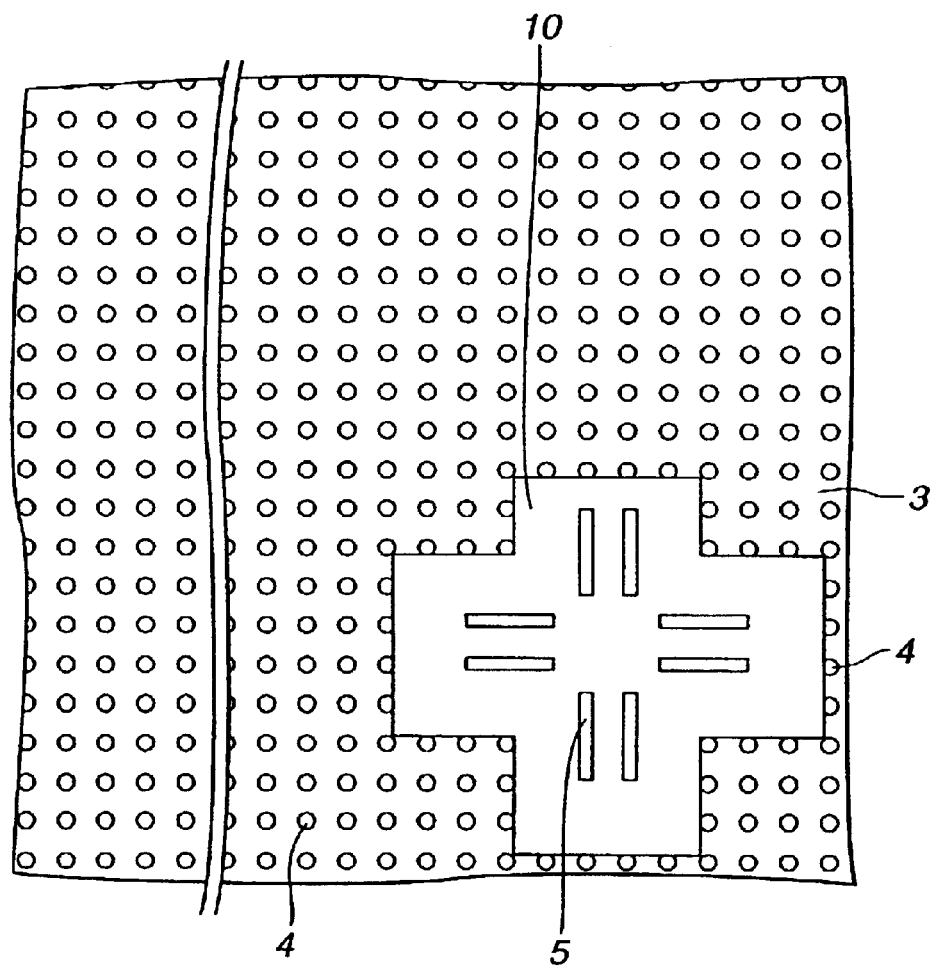
FIG. 2 is a plan view corresponding to FIG. 1A.

Further, exposure and development of the photoresist are performed using photolithography to expose the electrode layer 2 in a predetermined pattern and form openings 4 for a microlens array in the photoresist 3. The opening 4 has a circular shape with a diameter of 5 $\mu$m. Openings 4 are arranged in a tow-dimensional array at common intervals of 18 $\mu$m in an area with a diameter of 95 mm, as illustrated in FIGS. 1A and 2. At the same time, rectangular openings 5 (in this embodiment, eight openings 5 arranged in a crisscross pattern) for an alignment marker with side lengths of 5 $\mu$m and 37 $\mu$m are formed at locations of the alignment marker surrounded by the array of openings 4 for the microlens array, as illustrated in FIG. 2.

The shortest distance between the opening 5 for the alignment marker and the opening 4 for the microlens is set at 20 $\mu$m. Further, an area ratio of the openings 5 for the alignment marker relative to an area 10 around the openings 5 surrounded by the openings 4 for the microlens array is set at a tenth ($\frac{1}{10}$), as illustrated in FIG. 2.

Any material, such as metal, semiconductor (a silicon wafer or the like), and insulating substance (such as glass, quartz and polymer film), can be used as the substrate material. When the metal material is used as the substrate 1, there is no need to form the electrode layer 2. Further, when the semiconductor is used, the electrode layer 2 is not necessarily needed if the semiconductor has enough conductivity to enable electroplating or electrodeposition.

The material of the electrode layer 2 is selected from materials which are not corrosive to the following electroplating liquid used since the electrode layer 2 is exposed to the electroplating liquid. Further, the electrode layer 2 is preferably such a material that cannot form an alloy with the following first plated layer and cannot be etched in the electroplating liquid, since a part of the first plated layers formed on the electrode layer 2 is removed by etching, for example. The first mask layer 3 may be formed of any inorganic or organic insulating material. A thin-film forming method, such as a vacuum-evaporating method, a spin-coat method, a dip method and CVD, can be used as a method for forming the electrode layer 2 and the mask layer 3.

The openings 5 are formed in an area wider than an area of a microstructure array to be used, with a pitch corresponding to that of the microstructure array. The opening 5 can be formed in the mask layer 3 by photolithography and etching which can provide a minute or narrow opening. A photoresist can be used as a material of the mask layer 3 as discussed above. When the photoresist is used, the etching step of the mask layer material can be omitted.

Figure 1B:
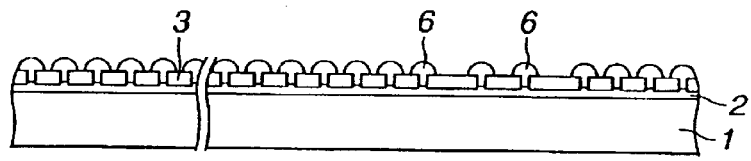
Figure 3:
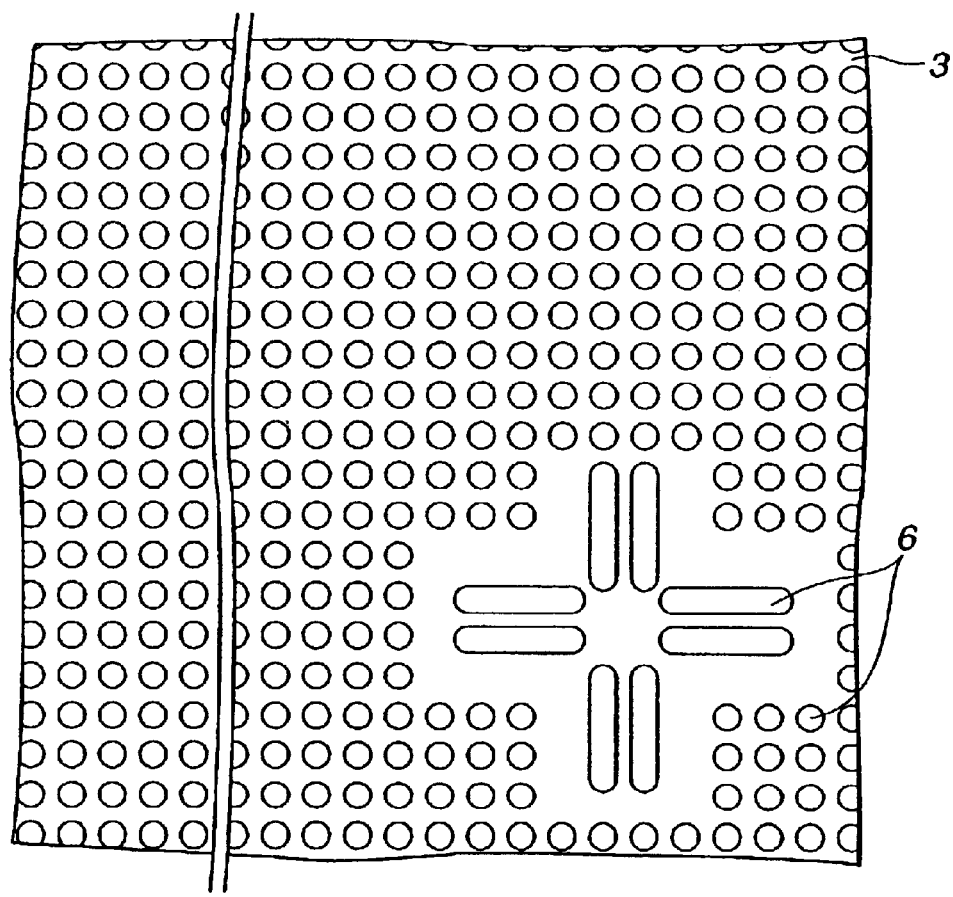
FIG. 3 is a plan view corresponding to FIG. 1B.

Ni electroplating is then performed while the electrode layer 2 is used as a cathode. A Ni electroplating bath containing nickel (II) sulfate, nickel (II) chloride, boric acid and brightener is used. The electroplating is conducted at the bath temperature of 50° C. and the cathode current density of 5 A/dm$^2$. Herein, no flow of electroplating liquid is caused to occur near the openings 4 and 5 during the electroplating process. A first Ni plated layer 6 is initially deposited in the openings 4 and 5 and grows therein. The first plated layer 6 expands onto the first mask layer 3, and a semispherical plated layer is thus formed as illustrated in FIGS. 1B and 3. The plated layer 6 is deposited until its radius reaches about 10 μm. Here, when the radius of the first plated layer 6 is about 10 μm in a central portion of the array, the first plated layer 6 with the maximum radius of about 15 μm is formed at the periphery of the array.

When the size (diameter or width) of the opening 3 is sufficiently smaller than the size of the anode for electroplating, the plated layer 6 grows isotropically with respect to a center of the opening 3. In the case of a circular opening, a semispherical plated layer can be obtained around the opening 3. Since the electroplating can be stopped the moment a current flowing between the cathode and the anode is stopped, the fabrication controllability of this method is superior to a conventional method in which an original substrate is formed by etching.

Figure 1C:
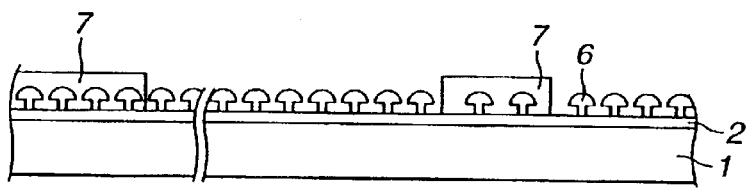
Figure 4:
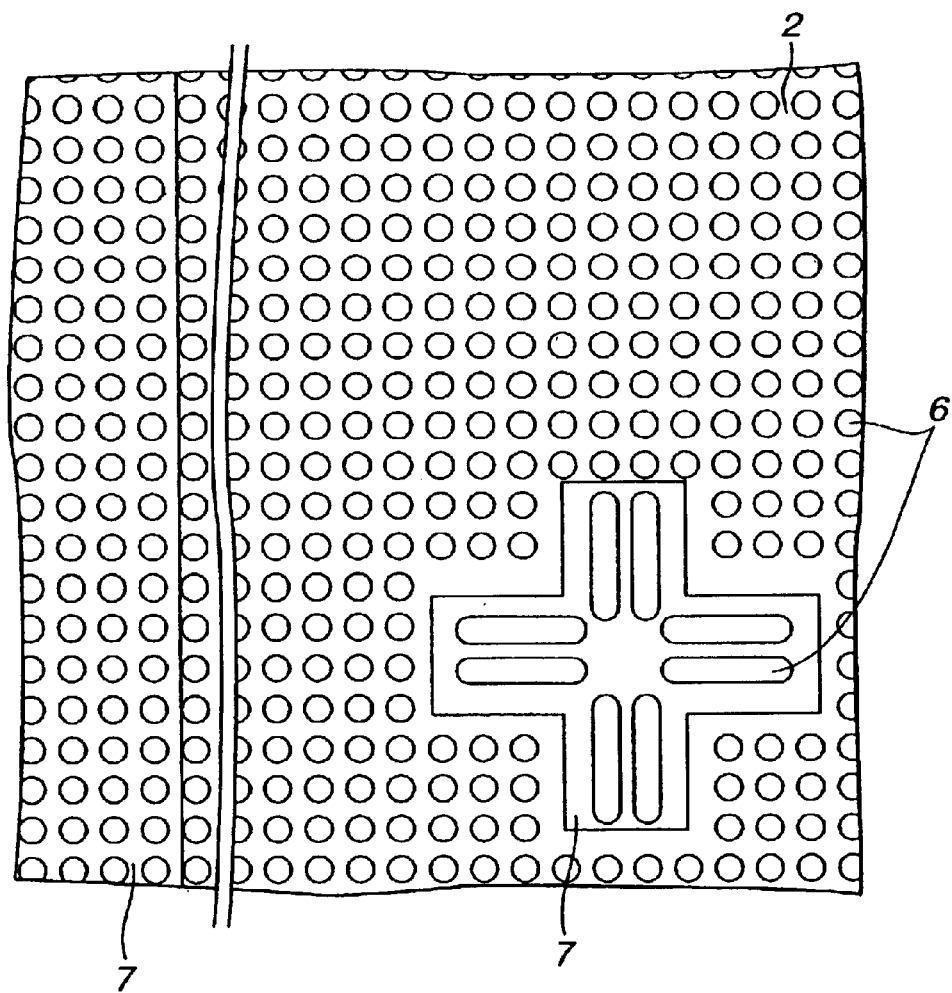
FIG. 4 is a plan view corresponding to FIG. 1C.

The first mask layer 3 is then removed with acetone and N,N-dimethylformamide. Further, coating, exposure and development of a positive photoresist (product name: AzP4620 produced by Clariant Com.) are performed to form second insulating mask layers 7 selectively on an area of 1064×808 plated layers 6 except the periphery of the array and on the rectangular plated layers 6 corresponding to the alignment marker. The first plated layers 6 around the area of 1064×808 plated layers 6 are thus exposed, as illustrated in FIGS. 1C and 4. Here, almost no adverse influences due to the openings 5 for the alignment marker occurs on the current density distribution. The diameter distribution of the first plated layers 6 in the area covered with the second mask layers 7 is hence within 5%.

Figure 1D:
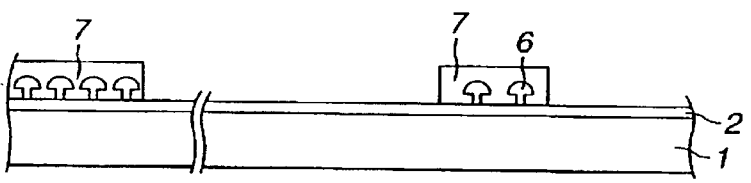
Figure 5:
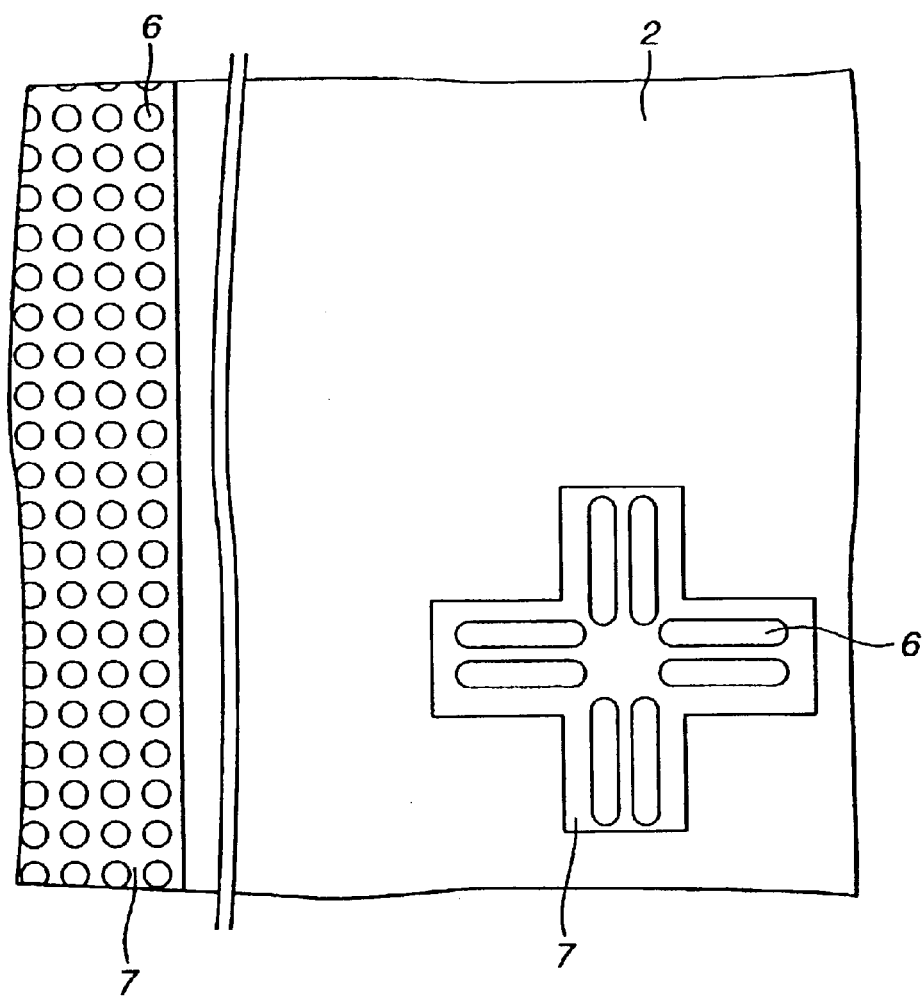
FIG. 5 is a plan view corresponding to FIG. 1D.

Electrolytic etching is then performed while the electrode layer 2 is used as an anode. A Ni electroplating bath containing nickel (II) sulfate, nickel (II) chloride, boric acid and brightener is used. The electrolytic etching of exposed first plated layers 6 is conducted at the bath temperature of 60° C. and the anode current density of 8 A/dm$^2$, as illustrated in FIGS. 1D and 5. The electrode layer 2 is not eroded since it is formed of Pt. The electrolytic etching is stopped when the Ni plated layers 6 in the area without the second mask layer 7 are consumed.

Figure 1E:
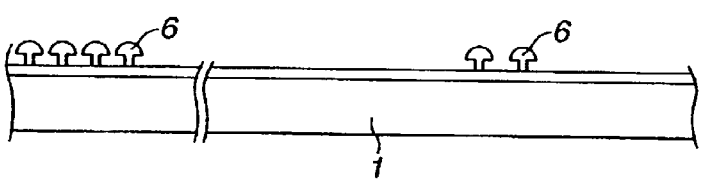
Figure 6:
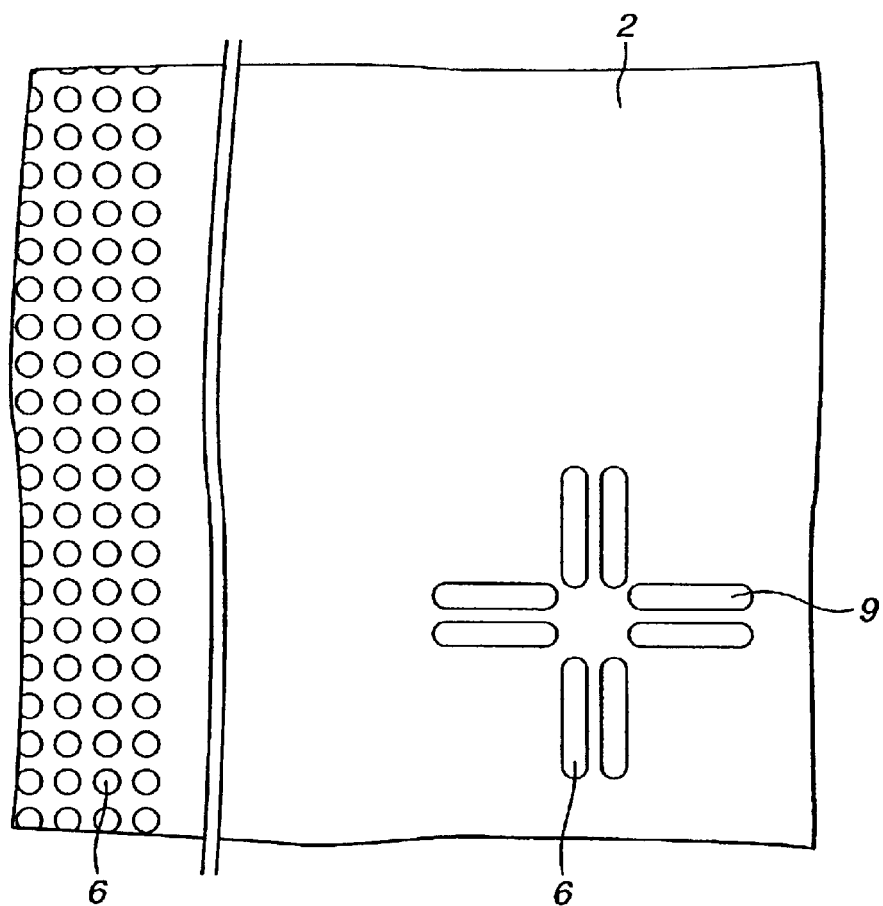
FIG. 6 is a plan view corresponding to FIG. 1E.

The second mask layer 7 is then removed with acetone and N,N-dimethylformamide. Thus, the array of 1064×808 plated layers 6 and the plated layers 6 for the alignment marker are formed as illustrated in FIGS. 1E and 6. The radius distribution of the first plated layers 6 is within 5%.

Figure 1F:
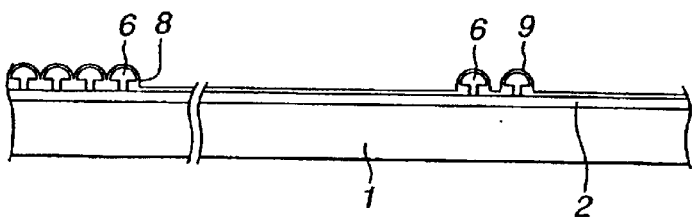
Figure 7:
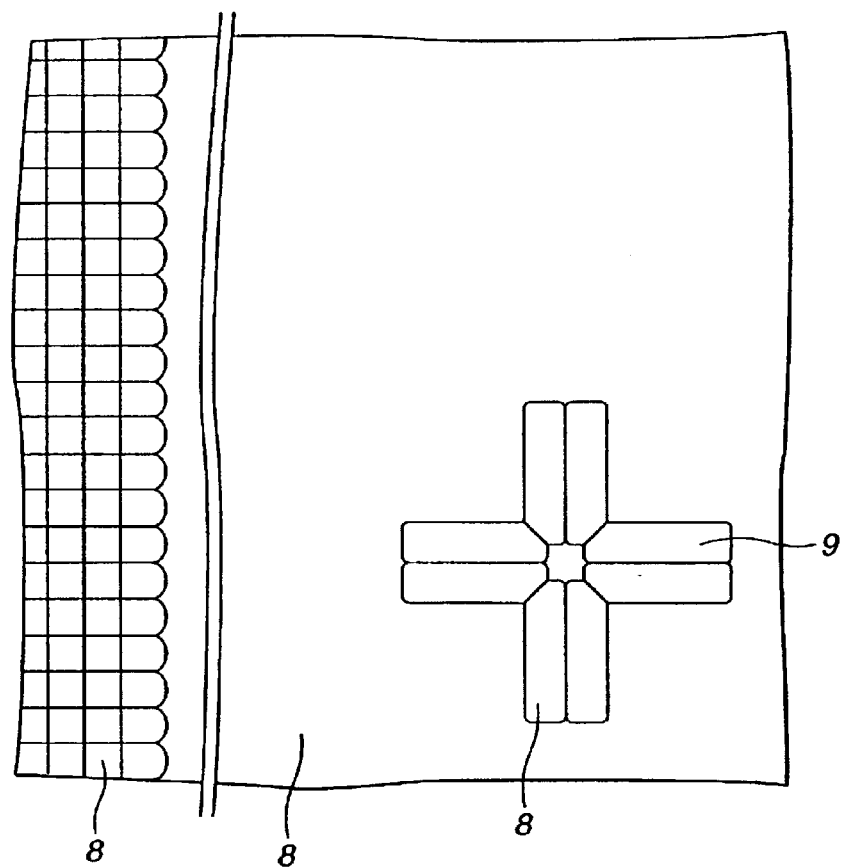
FIG. 7 is a plan view corresponding to FIG. 1F.

Ni electroless plating is then performed at a bath temperature of 90° C. to form a second plated layer 8, as illustrated in FIGS. 1F and 7. Ni electroless plating solution (product name; Alnic CT produced by Packs Com.) containing a reducing agent of hypophosphite is used. The first plated layers 6 are firmly fixed to the electrode layer 2 by the second plated layer 8. A bright mold for a microlens array with an alignment marker 9 can be obtained since the electroless plating is used for the formation of the second plated layer 8. Radii of curvature of each plated layer are approximately equal in its diagonal and horizontal directions, and the average radius of curvature is 20 μm. A distribution or variation of the radius of curvature is within ±1 μm, and a mold with a uniform profile of the plated layer can be produced. Further, a height distribution of the plated layers for the microlens array and the plated layers for the alignment marker 9 is also within 5%.

The above plated layer is formed by the deposition of metal ions in the electroplating bath caused by the electrochemical reaction. The thickness of the electroplated layer can be readily controlled by controlling the electroplating time and temperature. A variety of materials can be used as electroplating metal. As a single metal, Ni, Au, Pt, Cr, Cu, Ag, Zn and the like can be employed. As an alloy, Cu—Zn, Sn—Co, Ni—Fe, Zn—Ni and the like can be used. Any material can be used so long as electroplating is possible. The above is the same with respect to electrodeposition. As an electrodeposition liquid, an electrodepositable organic compound may be used (acryl-series resin and the like in the case of the anionic-type electrodeposition, and epoxy-series resin and the like in the case of the cationic-type electrodeposition).

In the above process, the plated layer grows larger at a peripheral portion of the microstructure array than in its central portion because the current density distribution is uneven and a current is slightly condensed at the peripheral portion. Therefore, when the area of the openings 6 for the microstructure array is set wider than an area of the microstructure array to be used, plated layers grown a little more largely than those in the central portion fall outside the area to be used.

As described above, in this embodiment, the radius distribution of microlenses can be readily reduced, and an alignment marker for a precise alignment can be formed in a mold for a microlens array.

A fabrication method of a mold for a microlens array will be described. In this case, the above structure is used as a master.

A remover agent for electroplating is coated on the mold master. Ni electroplating is then performed while this substrate is used as a cathode. A Ni electroplating bath containing nickel (II) sulfamate, nickel (II) bromide, boric acid and brightener is used. The electroplating is conducted at the bath temperature of 50° C. and the cathode current density of 5 A/dm². After that, a mold is separated from the substrate to obtain the mold for a microlens array.

A convex microlens array is fabricated by using the above mold. For example, after an ultraviolet-ray hardening resin is laid over the mold, a glass substrate of a support substrate is placed on the resin. After the resin is exposed to ultraviolet rays through the glass substrate to be hardened, the glass substrate with the resin is separated from the mold. The convex microlens array is thus fabricated. This microlens array is provided with an alignment marker for a precise alignment, and the distribution of the lens diameter is within 5%.

Figure 27:
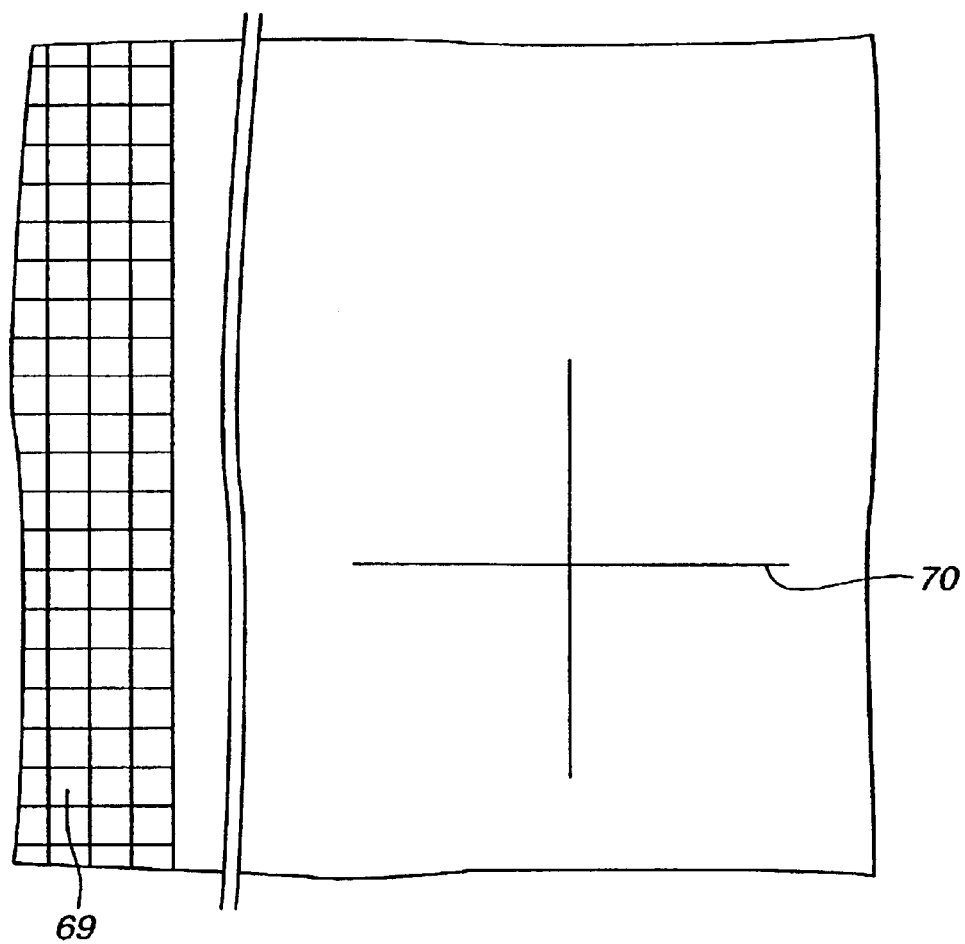
FIG. 27 is a plan view illustrating an alignment marker on a driver substrate suitable for the first and fifth embodiments.

The alignment marker 9 of this embodiment can be precisely aligned preferably with an alignment marker 70 formed on a driver substrate with pixels 69 as illustrated in FIG. 27.

When the microlens array is to be bonded to a driver substrate or the like, top points of each lens of the microlens array and the alignment marker are brought into a depth of focus of a lens system on the side of an aligning apparatus since those top points are approximately on the same level in height. Hence a highly precise alignment can be achieved.

The mold for a microlens array can be fabricated directly from an original substrate formed by electroplating. Therefore, no expensive equipment is needed, and the mold can be fabricated at low costs. The mold can be mechanically separated from the original. In the case of a large-sized mold, there is a fear that the mold is deformed when separated from the original. Accordingly, the mold can be separated by removing the substrate, the mask layer and the first plated layer sequentially from the bottom surface.

When the mold is formed after a sacrificial layer is formed on the substrate and the second plated layer, the mold can be separated from the substrate by removing the sacrificial layer. In this case, a material of the sacrificial layer is selected such that the mold cannot be corroded by an etchant for etching the sacrificial layer. Where none of the first and second plated layers and the substrate are corroded by the etchant for etching the sacrificial layer, the substrate with the plated layers can be used as an original a plurality of times. When the original becomes unusable due to damage, contamination and the like after plural uses, a mold master can be fabricated by the same method as above.

As a material of the mold, any material, such as resin, metal, and insulating substance, can be used so long as it can be formed on the substrate with the plated layer. In a simple method of fabricating the mold, a material, such as resin, metal, or fused or dissolved glass, is coated on the substrate, and the material is separated from the mold after hardened. When metal is used, metal that will not produce an alloy with the substrate and the plated layer is selected.

For example, when a marker formed on a driver substrate of a display device, such as a TFT liquid crystal substrate, or an image pickup device is aligned with the alignment marker of the convex microlens array and the driver substrate and the microlens array are bonded, each microlens can be set at a position corresponding to each pixel or light-receiving portion. When those bonded structures are connected to a driver circuit and driven as a liquid crystal projector, for example, incident light is condensed by each microlens and a bright display image can be obtained.

Figure 8:
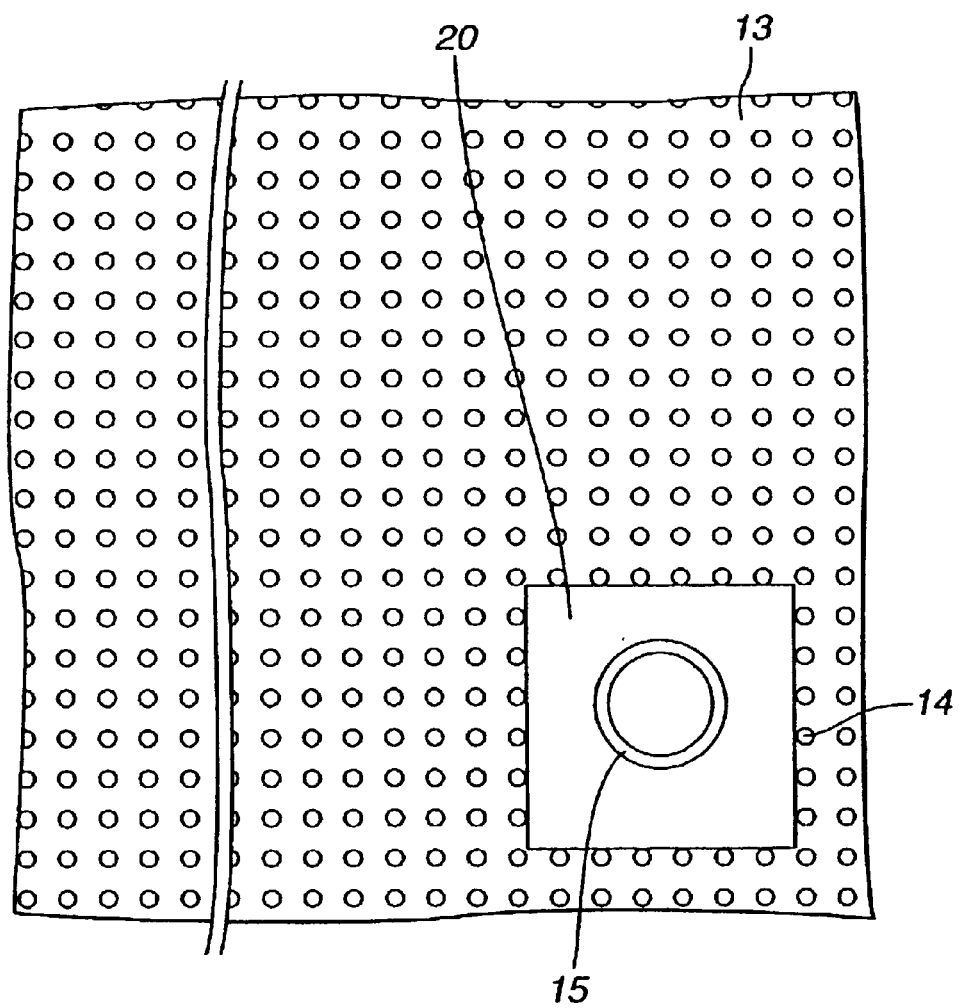
FIG. 8 is a plan view illustrating an electroplating growth step in a fabrication method of a mold for forming a microlens array of a second embodiment according to the present invention.
Figure 9:
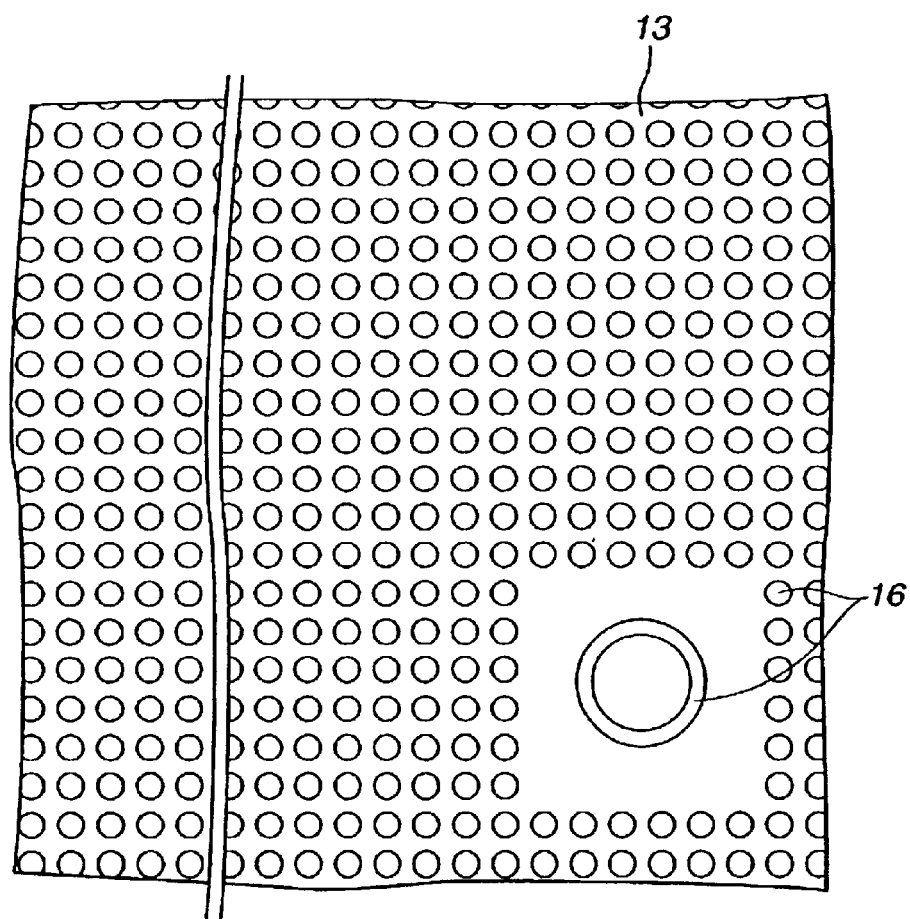
FIG. 9 is a plan view illustrating another electroplating growth step in the fabrication method of the second embodiment.

A second embodiment of the present invention will be described with reference to FIGS. 8 and 9. Also in the second embodiment, a silicon wafer with a diameter of four inches is thermally oxidized using an oxidizing gas, and layers of silicon dioxide with a thickness of 1 μm are formed on opposite surfaces of the wafer. This wafer is processed similarly to the first embodiment. Thus, an electrode layer is exposed in a predetermined pattern, and openings 14 for a microlens array are formed in a first mask layer 13 of photoresist, as illustrated in FIG. 8. The opening 14 has a circular shape with a diameter of 5 μm. Openings 14 are arranged in a two-dimensional array at common intervals of 18 μm in an area with a diameter of 95 mm, as illustrated in FIG. 8. At the same time, ring-shaped openings 15 for an alignment marker with a width of 5 μm and an inner diameter of 56 μm are formed at locations of the alignment marker, as illustrated in FIG. 8. This ring-shaped opening 15 is a feature of the second embodiment.

The shortest distance between the opening 15 for the alignment marker and the opening 14 for the microlens is set at 30 μm. Further, an area ratio of the opening 15 for the alignment marker relative to an area 20 around the opening 15 surrounded by the openings 14 for the microlens array is set at three fortieths (3/40), as illustrated in FIG. 8.

Ni electroplating is then performed similarly to the first embodiment. The electroplating is conducted at the bath temperature of 50° C. and the cathode current density of 40 A/dm². Similarly to the first embodiment, a first plated layer 16 is deposited until its radius reaches about 10 μm, as illustrated in FIG. 9. Here, when the radius of the first plated layer 16 is about 10 μm in a central portion of the array, the first plated layer 16 with the maximum radius of about 15 μm is formed at the periphery of the array.

Then, similarly to the first embodiment, the first mask layer 13 is removed, and second mask layers are formed selectively on an area of 1064×808 plated layers 16 except the periphery of the array and on the plated layers 16 corresponding to the alignment marker. Here, almost no adverse influences due to the openings 15 for the alignment marker occurs on the current density distribution. The diameter distribution of the first plated layers 16 in the area covered with the second mask layers is within 5%.

Electrolytic etching of the exposed first plated layers 16 is then performed, similarly to the first embodiment. The electrode layer is not eroded since it is formed of Pt. The electrolytic etching is stopped when the Ni plated layers 16 in the area without the second mask layer are consumed.

The second mask layers are then removed, similarly to the first embodiment. Thus, an array of 1064×808 first plated layers 16 and a ring-shaped alignment marker are formed. The radius distribution of the first plated layers 16 is within 5%.

Ni electroless plating is then performed, similarly to the first embodiment. The first plated layers 16 are firmly fixed to the electrode layer by a second plated layer. Radii of curvature of each plated layer are approximately equal in its diagonal and horizontal directions, and the average radius of curvature is 20 μm. A distribution or variation of the radius of curvature is within ±1 μm, and a mold with a uniform profile of the plated layer can be produced. Further, a height distribution of the plated layers for the microlens array and the plated layers for the alignment marker is also within 5%.

As described above, also in this embodiment, the radius distribution of microlenses can be readily reduced, and a ring-shaped alignment marker for a precise alignment can be formed in a mold for a microlens array.

As described in the first embodiment, a mold for a microlens array can be fabricated using the above structure as a mold master. Further, a convex microlens array can be fabricated by using this mold. The convex microlens array is provided with an alignment marker for a precise alignment, and the distribution of the lens diameter is within 5%.

A third embodiment of the present invention will be described with reference to FIGS. 10 and 11. In the third embodiment, rectangular openings for an alignment marker with side lengths of 5 μm and 37 μm and ring-shaped openings for an alignment marker with a width of 5 μm and an inner diameter of 56 μm are formed at locations of the alignment marker, as illustrated in FIG. 10.

The shortest distance between the opening for the alignment marker and the opening for the microlens is set at 20 μm. Further, an area ratio of the opening for the alignment marker relative to an area around this opening surrounded by the openings for the microlens array is set at seven eightieths (7/80).

Figure 10:
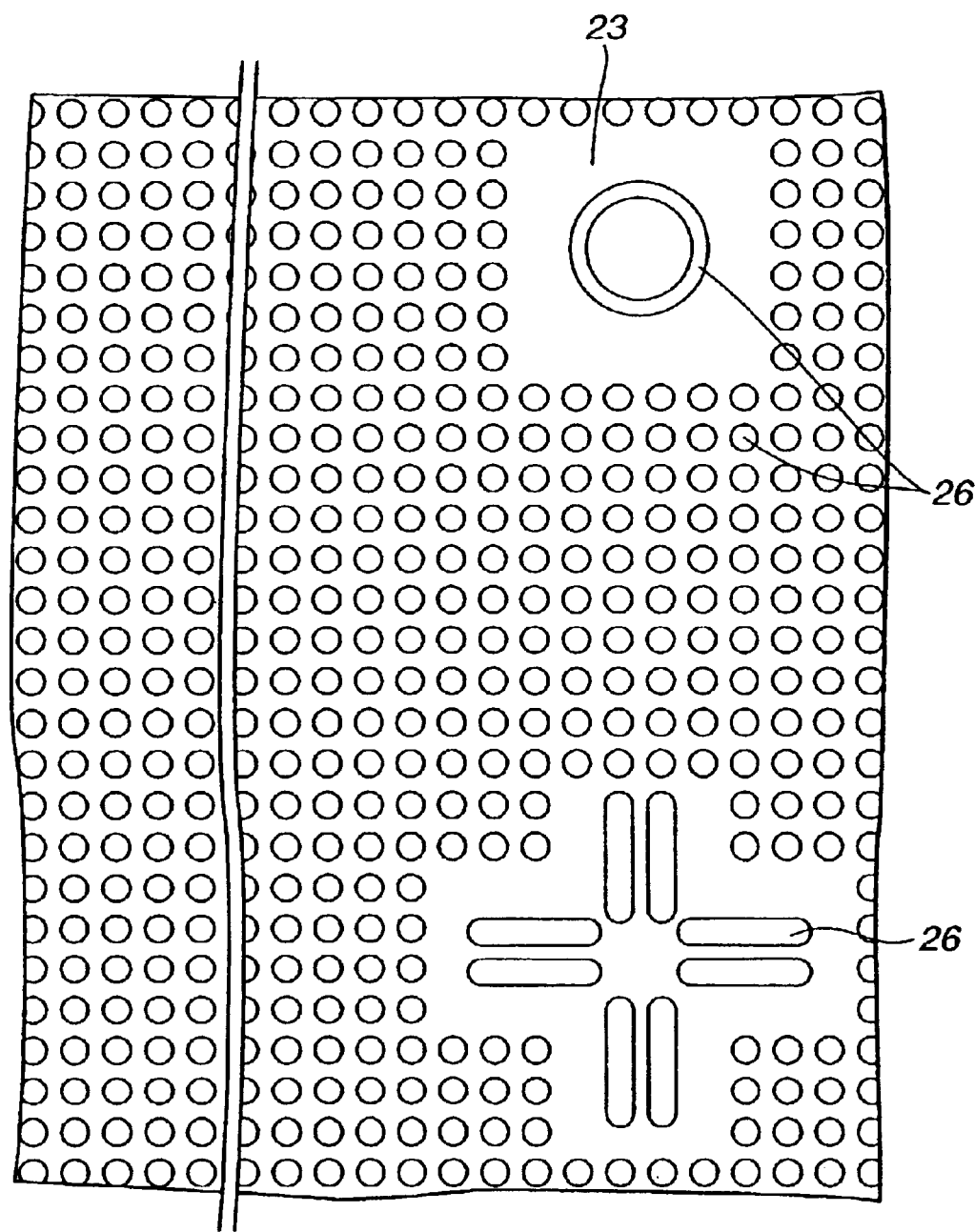
FIG. 10 is a plan view illustrating an electroplating growth step in a fabrication method of a mold for forming a microlens array of a third embodiment according to the present invention.
Figure 11:
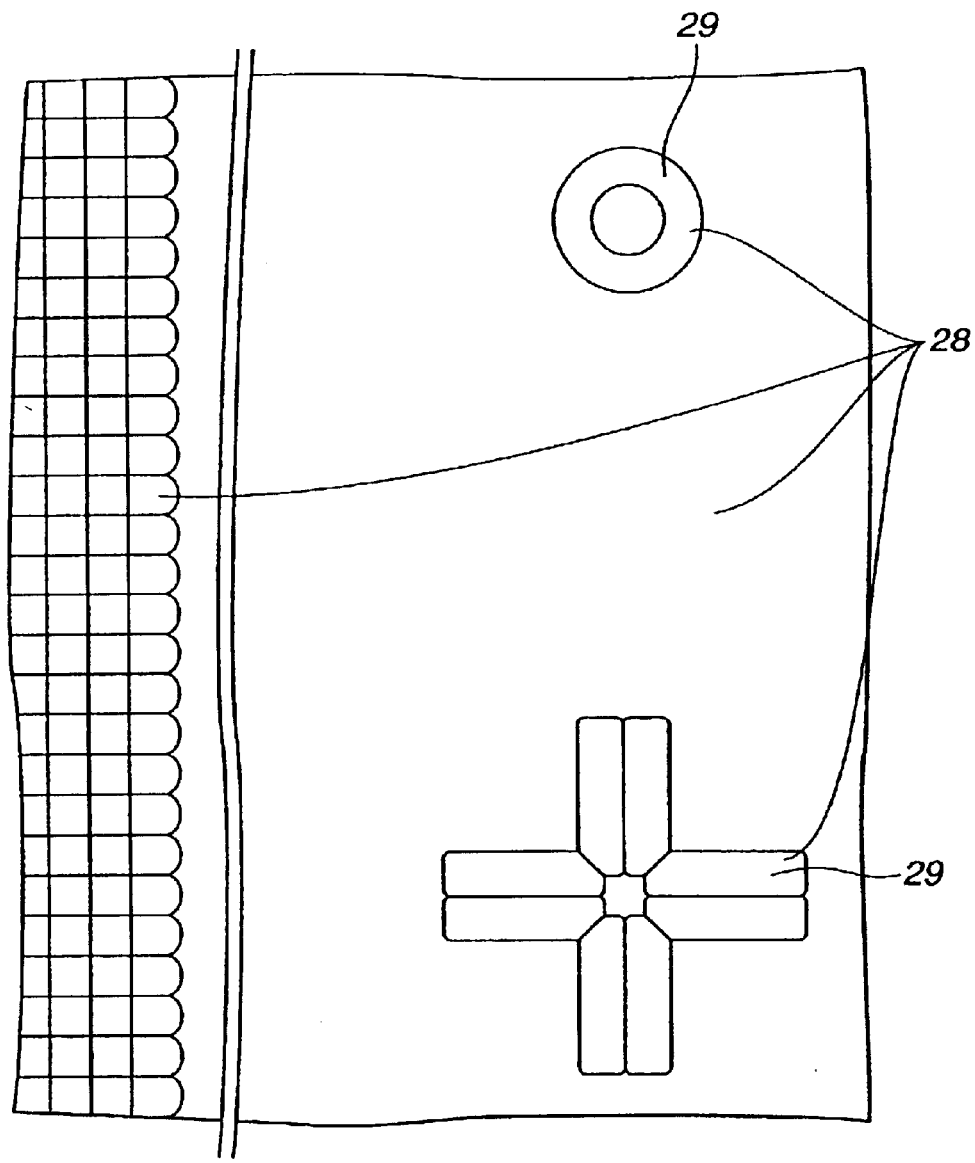
FIG. 11 is a plan view illustrating another electroplating growth step in the fabrication method of the third embodiment.
Figure 12:
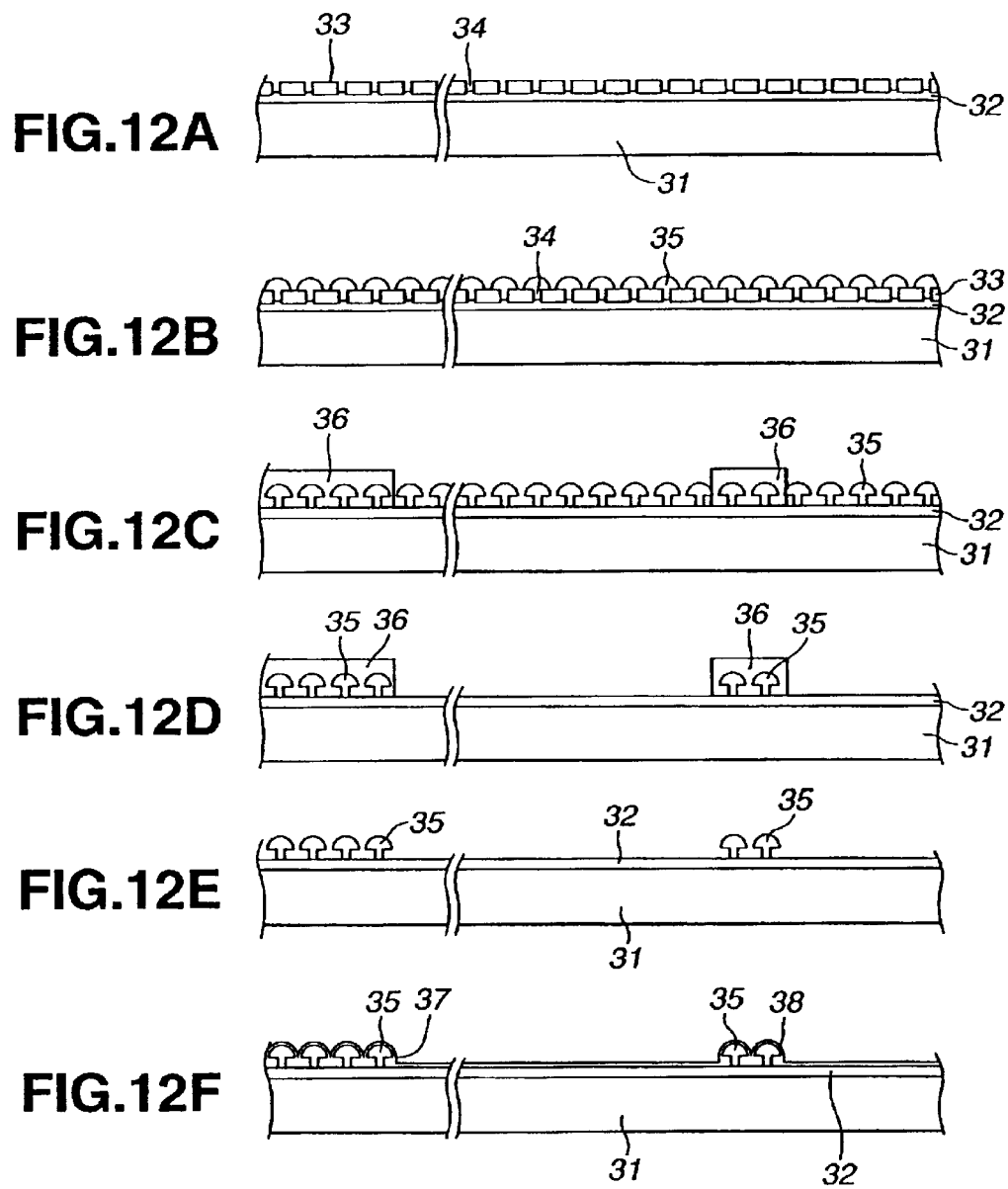
FIGS. 12A to 12F are cross-sectional views illustrating electroplating growth steps in a fabrication method of a mold for forming a microlens array of a fifth embodiment according to the present invention, respectively.
Figure 13:
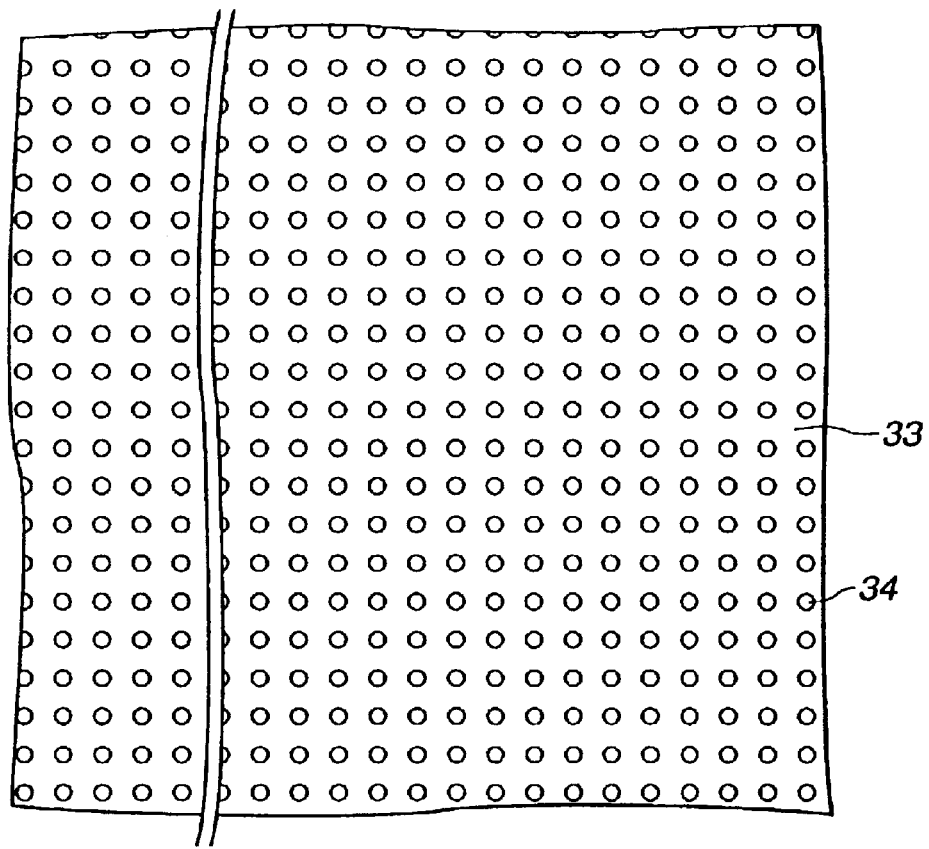
FIG. 13 is a plan view corresponding to FIG. 12A.

Also in the third embodiment, first plated layers 26 are formed in the openings and on a first mask layer 23 as illustrated in FIG. 10, and a second plated layer 28 is formed on the first plated layers 26 as illustrated in FIG. 11, similarly to the first embodiment.

Also in this embodiment, the radius distribution of microlenses can be readily reduced, and rectangular and ring-shaped alignment markers 29 for a precise alignment can be formed in a mold for a microlens array, as illustrated in FIG. 11.

Figure 30:
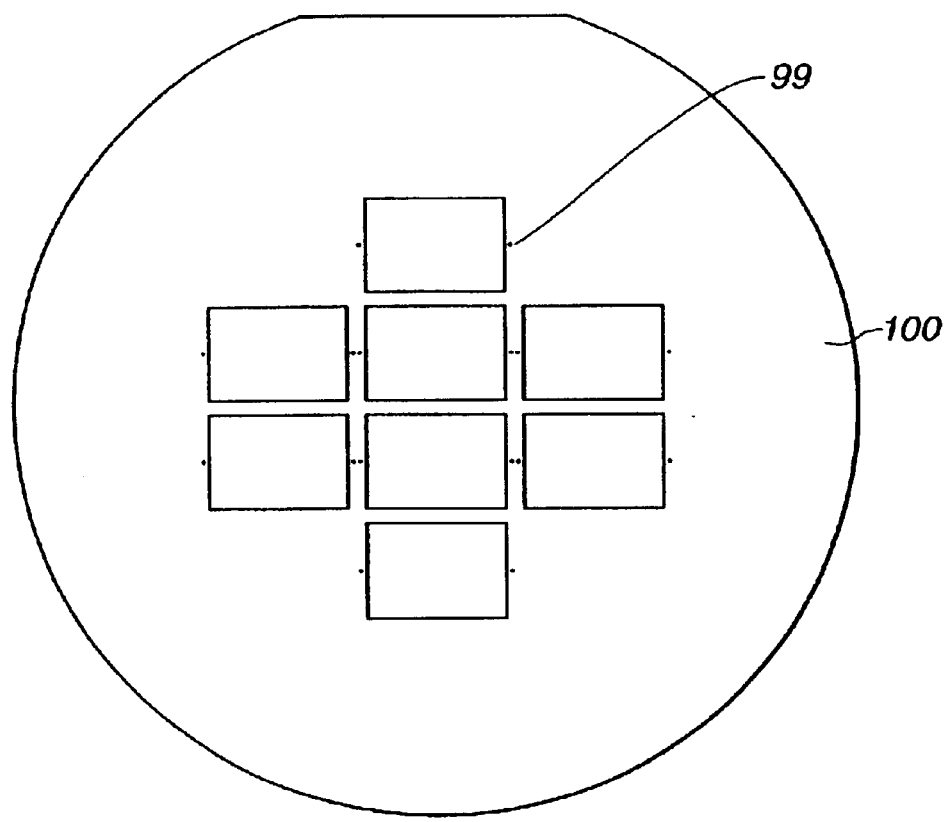
FIG. 30 is a plan view illustrating a mold for forming a plurality of microlens arrays with an alignment marker of a fourth embodiment.

A fourth embodiment of the present invention will be described with reference to FIG. 30. In the fourth embodiment, a silicon wafer 100 with a diameter of five inches is thermally oxidized using an oxidizing gas, and layers of silicon dioxide with a thickness of 1 μm are formed on opposite surfaces of the wafer. This wafer is processed similarly to the first embodiment. Thus, an electrode layer is exposed in a predetermined pattern, and openings for a plurality of sets of microlens arrays are formed in a first mask layer of photoresist. The opening has a circular shape with a diameter of 5 μm. Openings are arranged in a two-dimensional array at common intervals of 18 μm in an area with a diameter of 120 mm. At the same time, rectangular openings for an alignment marker with side lengths of 5 μm and 37 μm and ring-shaped openings for an alignment marker with a width of 5 μm and an inner diameter of 56 μm are formed at locations of alignment markers 99, as illustrated in FIG. 30.

An area ratio of the opening for the alignment marker relative to an area around this opening surrounded by the openings for the microlens array is set at twenty one eightieths (21/80).

Ni electroplating is then performed similarly to the first embodiment. The electroplating is conducted at the bath temperature of 50° C. and the cathode current density of 40 A/dm². Similarly to the first embodiment, a first plated layer is deposited until its radius reaches about 10 μm. Here, when the radius of the first plated layer is about 10 μm in a central portion of the array, the first plated layer with the maximum radius of about 15 μm is formed at the periphery of the array.

Then, similarly to the first embodiment, the first mask layer is removed, and second mask layers are formed selectively on eight areas of 1064×808 plated layers and eight sets of the plated layers for alignment markers. Each set of the plated layers for the alignment marker for each area includes two zones for the alignment marker disposed on opposite sides of the each area, as illustrated in FIG. 30. Here, almost no adverse influences due to the opening for the alignment marker occurs on the current density distribution. The diameter distribution of the first plated layers in the eight areas covered with the second mask layers is within 5%.

Electrolytic etching of the exposed first plated layers is then performed, similarly to the first embodiment. The electrode layer is not eroded since it is formed of Pt. The electrolytic etching is stopped when the Ni plated layers in the area without the second mask layer are consumed.

The second mask layer is then removed, similarly to the first embodiment. Thus, eight sets of two-dimensional arrays of 1064×808 first plated layers and eight sets of the alignment markers are formed. The radius distribution of the first plated layers in each area is within 5%. Herein, each of the alignment markers is composed of any one of the first to third embodiments and combinations thereof such that those alignment markers are different from each other.

Ni electroless plating is then performed, similarly to the first embodiment. The first plated layers are firmly fixed to the electrode layer by a second plated layer. Radii of curvature of each plated layer are approximately equal in its diagonal and horizontal directions, and the average radius of curvature is 20 μm. A distribution or variation of the radius of curvature is within ±1 μm, and a mold with a uniform profile of the plated layer can be produced. Further, a height distribution of the plated layers for the microlens array and the plated layers for the alignment marker is also within 5%.

As described above, also in this embodiment, the radius distribution of microlenses can be readily reduced, and an alignment marker for a precise alignment can be formed in each mold for a microlens array.

A fabrication method of a mold for a microlens array will be described. In this method, the above structure is used as a mold master.

A remover agent for electroplating is coated on the above mold master. Ni electroplating is then performed while this substrate is used as a cathode. A Ni electroplating bath containing nickel (II) sulfamate, nickel (II) bromide, boric acid and brightener is used. The electroplating is conducted at the bath temperature of 50° C. and the cathode current density of 5 A/dm². After that, the mold is separated from the substrate to form a mold for a microlens array.

A convex microlens array is fabricated by using the above mold. After an ultraviolet-ray hardening resin is laid over the mold, a glass substrate of a support substrate is placed on the resin. After the resin is exposed to ultraviolet rays to be hardened, the glass substrate with the resin is separated from the mold. The resin is cut into eight pieces, and eight convex microlens arrays are thus fabricated. Each microlens array is provided with the alignment marker 99 for a precise alignment, and the distribution of the lens diameter is within 5%.

A fifth embodiment of the present invention will be described with reference to FIGS. 12A to 18. Also in the fifth embodiment, a silicon wafer with a diameter of four inches is thermally oxidized using an oxidizing gas, and layers of silicon dioxide with a thickness of 1 μm are formed on opposite surfaces of the wafer. This wafer is used as a substrate 31 illustrated in FIGS. 12A to 12F. Ti and Pt are continuously layered with thicknesses of 50 Å and 500 Å on the above wafer, respectively, using a vacuum sputtering method. An electrode layer 32 is thus formed. A positive photoresist (product name: Az1500) is then deposited to form a first mask layer 33.

Further, exposure and development of the photoresist are performed using photolithography to expose the electrode layer 32 in a predetermined pattern and form openings 34 for a microlens array and an alignment marker in the photoresist 33. The opening 34 has a circular shape with a diameter of 5 μm. Openings 34 for the microlens array and the alignment marker are arranged in a common two-dimensional array at common intervals of 18 $\mu$m in an area with a diameter of 95 mm, as illustrated in FIGS. 12A. and 13. In this point this embodiment differs from the above embodiments.

Figure 14:
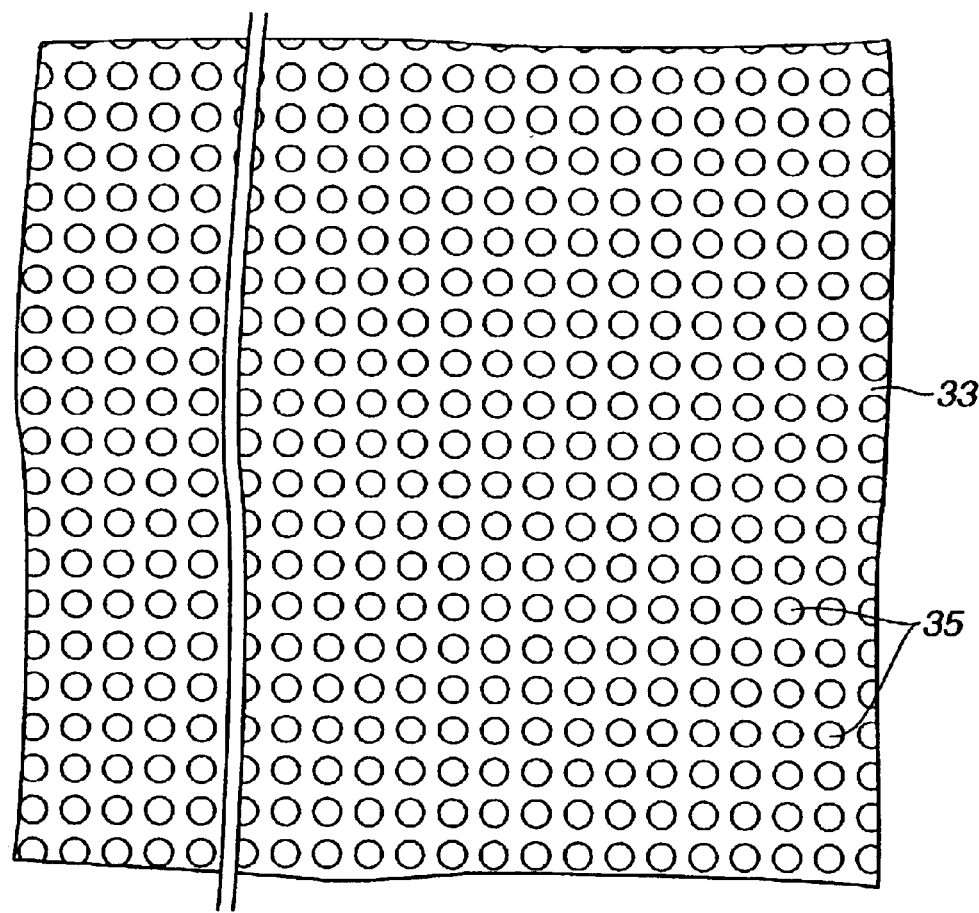
FIG. 14 is a plan view corresponding to FIG. 12B.

Ni electroplating is then performed while the electrode layer 32 is used as a cathode. A Ni electroplating bath containing nickel (II) sulfate, nickel (II) chloride, boric acid and brightener is used. The electroplating is conducted at the bath temperature of 50° C. and the cathode current density of 40 A/dm$^2$. Herein, no flow of electroplating liquid is caused to occur near the openings 34 during the electroplating process. A first Ni plated layer 35 is initially deposited in the opening 34 and grows therein. The first plated layer 35 expands onto the first mask layer 33, and a semispherical plated layer is thus formed as illustrated in FIGS. 12B and 14. The plated layer 35 is deposited until its radius reaches about 10 $\mu$m. Here, when the radius of the first plated layer 35 is about 10 $\mu$m in a central portion of the array, the first plated layer 35 with the maximum radius of about 15 $\mu$m is formed at the periphery of the array.

Figure 15:
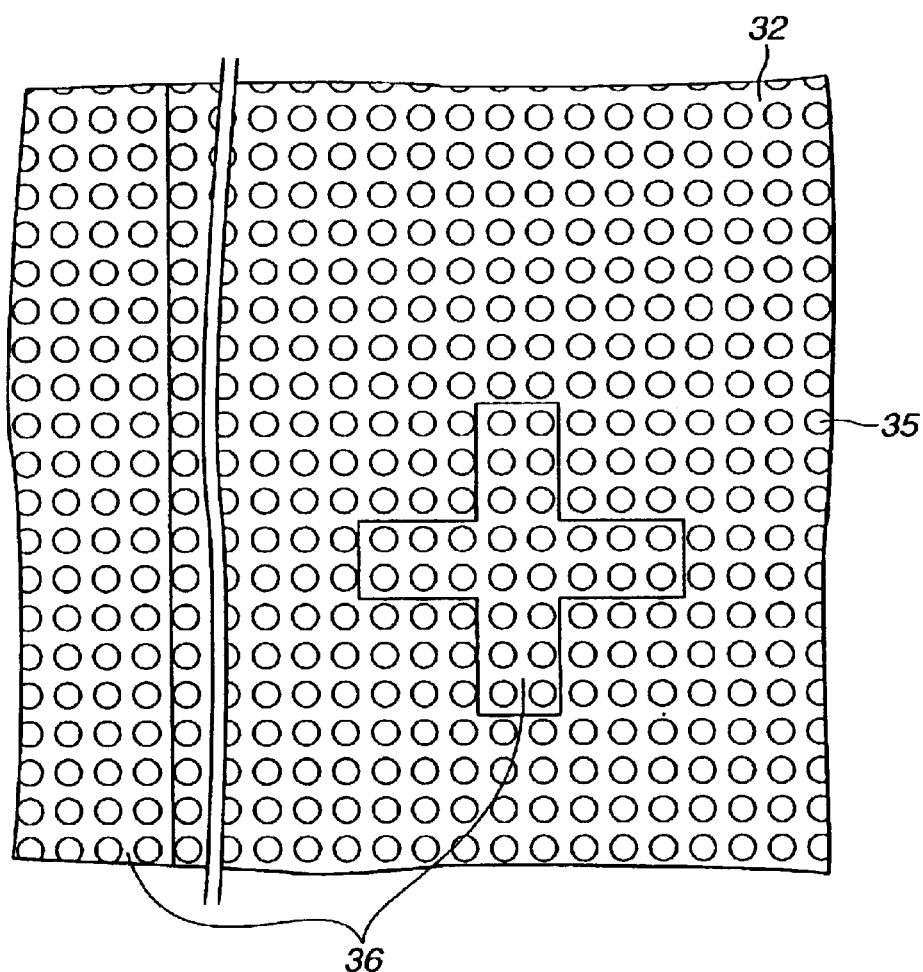
FIG. 15 is a plan view corresponding to FIG. 12C.

The first mask layer 33 is then removed with acetone and N,N-dimethylformamide. Further, coating, exposure and development of a positive photoresist (product name: AzP4620) are performed to form second mask layers 36 selectively on an area of 1064×808 plated layers 35 except the periphery of the array and on the plated layers 35 grown in an area corresponding to the alignment marker. The first plated layers 35 around the area of 1064×808 plated layers 35 are exposed, as illustrated in FIGS. 12C and 15. Here, almost no adverse influences due to the openings 34 for the alignment marker occurs on the current density distribution since the pattern of the openings 34 for the alignment marker are exactly the same as that of the openings 34 for the microlens array. Here, the second mask layer 36 on the area corresponding to the alignment marker is laid down over twenty eight (28) first plated layers 35 arranged in two rows in a crisscross pattern, as illustrated in FIG. 15.

Figure 16:
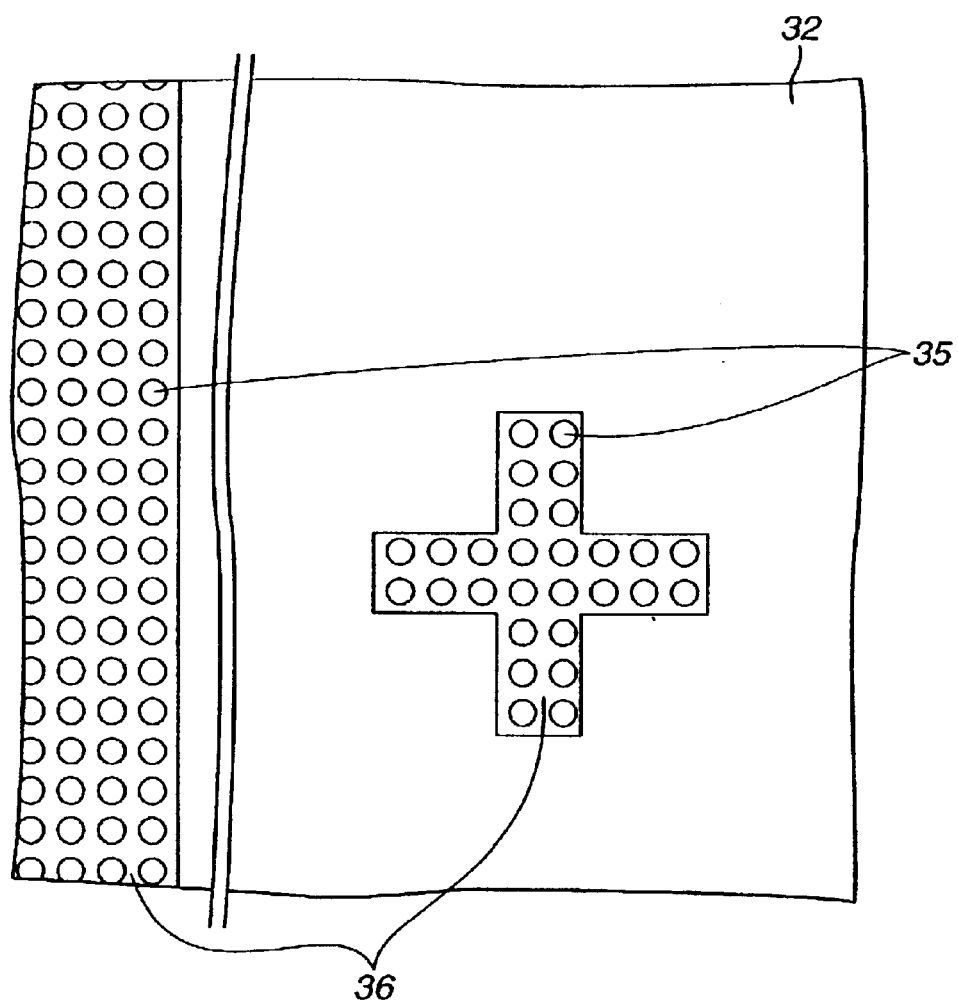
FIG. 16 is a plan view corresponding to FIG. 12D.

Electrolytic etching is then performed while the electrode layer 32 is used as an anode. A Ni electroplating bath containing nickel (II) sulfate, nickel (II) chloride, boric acid and brightener is used. The electrolytic etching of exposed first plated layers 35 is conducted at the bath temperature of 60° C. and the anode current density of 8 A/dm$^2$, as illustrated in FIGS. 12D and 16. The electrode layer 32 is not eroded since it is formed of Pt. The electrolytic etching is stopped when the Ni plated layers 35 in the area without the second mask layer 36 are consumed.

Figure 17:
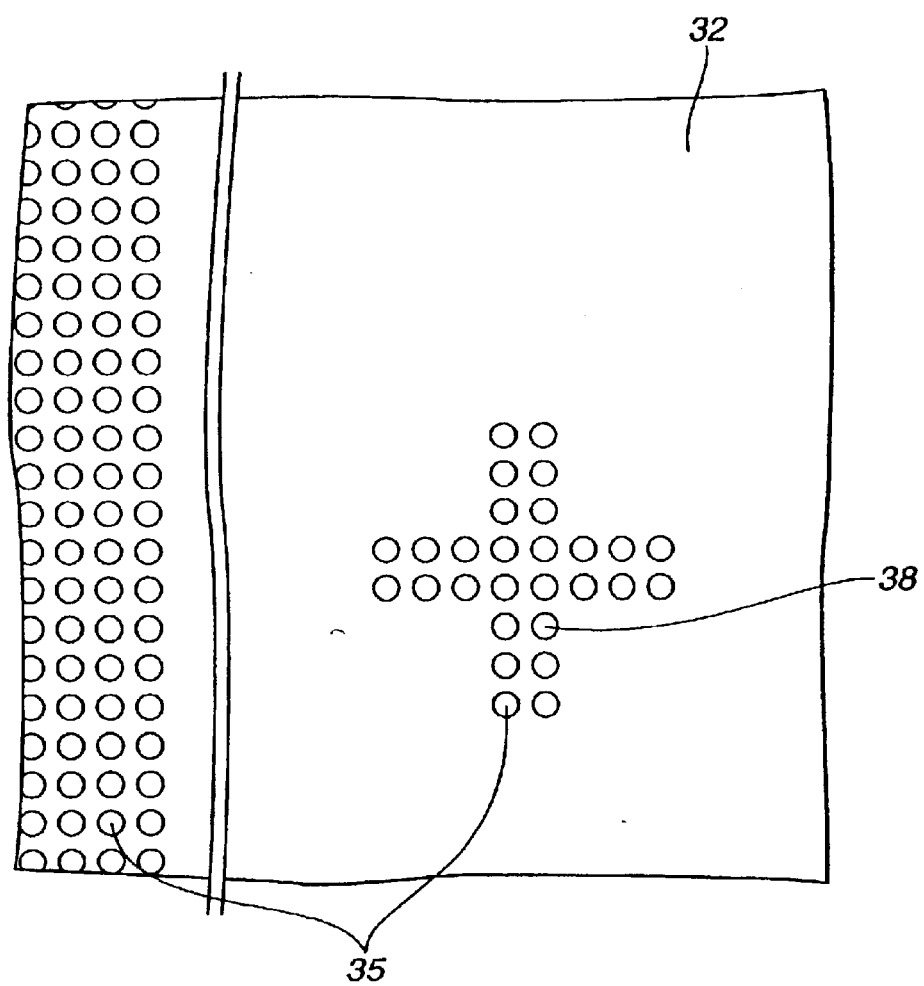
FIG. 17 is a plan view corresponding to FIG. 12E.

The second mask layer 36 is then removed with acetone and N,N-dimethylformamide. Thus, the array of 1064×808 plated layers 35 and the first plated layers 35 for the alignment marker in a crisscross pattern are formed as illustrated in FIGS. 12E and 17. The radius distribution of the first plated layers 35 is within 5%.

Figure 18:
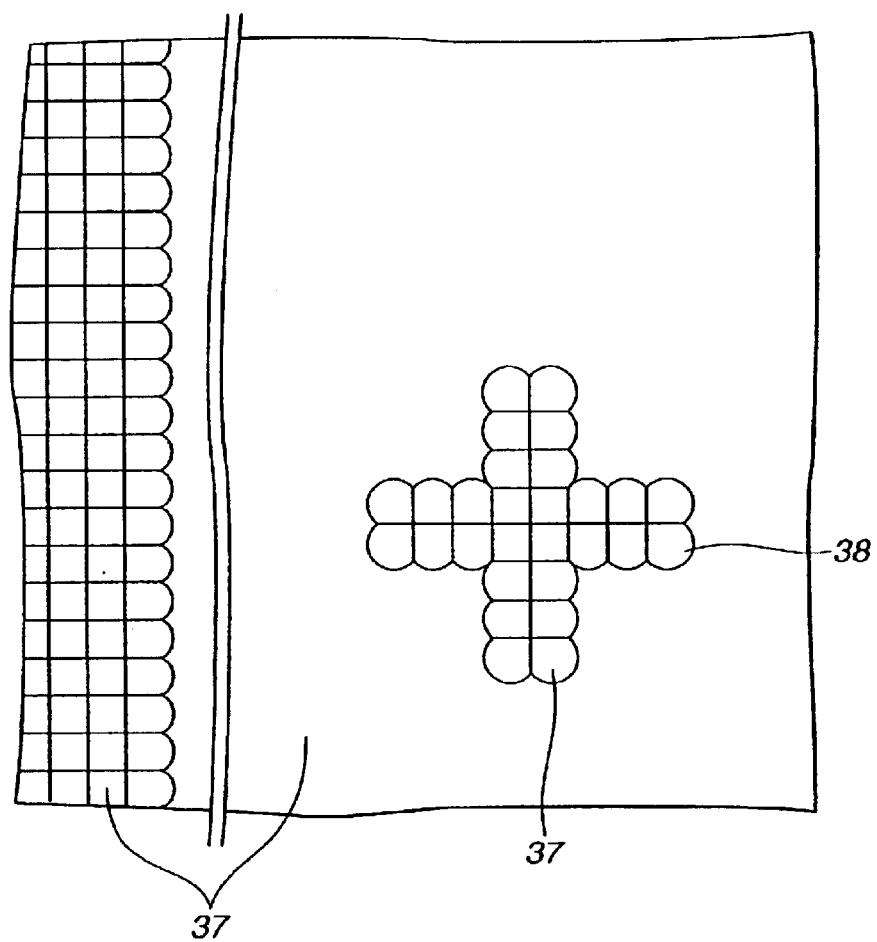
FIG. 18 is a plan view corresponding to FIG. 12F.

Ni electroless plating is then performed at a bath temperature of 90° C. to form a second plated layer 37, as illustrated in FIGS. 12F and 18. Ni electroless plating solution (product name: Alnic CT) containing a reducing agent of hypophosphite is used. The first plated layers 35 are firmly fixed to the electrode layer 32 by the second plated layer 37. A bright mold for a microlens array can be obtained since the electroless plating is used for the formation of the second plated layer 37. Radii of curvature of each plated layer are approximately equal in its diagonal and horizontal directions, and the average radius of curvature is 2 $\mu$m. Here, the second plated layer 37 is continuously formed, and no flat portion is present between semispherical structures. A distribution or variation of the radius of curvature is within ±1 $\mu$m, and a mold with a uniform profile of the semispherical structure can be produced. Further, a height distribution of the plated layers for microlenses and the plated layers for an alignment marker 38 is within 5%.

As described above, in this embodiment, the radius distribution of microlenses can be readily reduced, and the alignment marker 38 for a precise alignment can be readily formed in a mold for a microlens array. This alignment marker 38 can be precisely aligned with the alignment marker 70 formed on a driver substrate with pixels 69 as illustrated in FIG. 27.

A fabrication method of a mold for a microlens array will be described. In this method, the above structure is used as a mold master.

A remover agent for electroplating is coated on the mold master. Ni electroplating is then performed while this substrate is used as a cathode. A Ni electroplating bath containing nickel (II) sulfamate, nickel (II) bromide, boric acid and brightener is used. The electroplating is conducted at the bath temperature of 50° C. and the cathode current density of 5 A/dm$^2$. After that, the mold is separated from the substrate to form a mold for a microlens array.

A convex microlens array is fabricated by using the above mold. After an ultraviolet-ray hardening resin is laid over the mold, a glass substrate of a support substrate is placed on the resin. After the resin is exposed to ultraviolet rays to be hardened, the glass substrate with the resin is separated from the mold. The convex microlens array is thus fabricated. This microlens array is provided with the crisscross alignment marker for a precise alignment, and its distribution of the lens diameter is within 5%.

A sixth embodiment of the present invention will be described with reference to FIGS. 19 to 22. In the sixth embodiment also, a silicon wafer with a diameter of four inches is thermally oxidized using an oxidizing gas, and layers of silicon dioxide with a thickness of 1 $\mu$m are formed on opposite surfaces of the wafer. This wafer is processed similarly to the fifth embodiment. Thus, an electrode layer 42 is exposed in a predetermined pattern, and openings for a microlens array are formed in a first mask layer of photoresist. The opening has a circular shape with a diameter of 5 $\mu$m. Openings are arranged in an array at common intervals of 18 $\mu$m in an area with a diameter of 95 mm.

Figure 19:
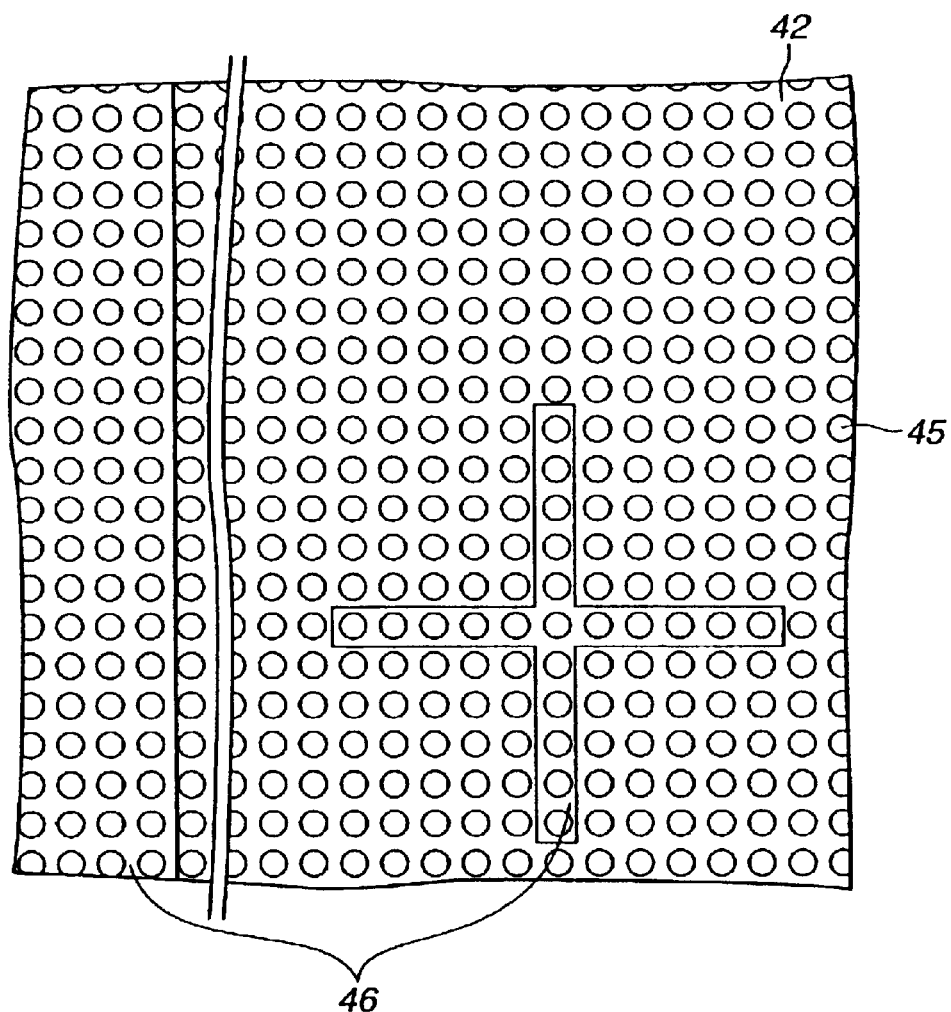
FIG. 19 is a plan view illustrating an electroplating growth step in a fabrication method of a mold for forming a microlens array of a sixth embodiment according to the present invention.

Ni electroplating is then performed similarly to the fifth embodiment. The electroplating is conducted at the bath temperature of 50° C. and the cathode current density of 40 A/dm$^2$. Similarly to the fifth embodiment, a first plated layer 45 is deposited until its radius reaches about 10 $\mu$m, as illustrated in FIG. 19. Here, when the radius of the first plated layer 45 is about 10 $\mu$m in a central portion of the array, the first plated layer 45 with the maximum radius of about 15 $\mu$m is formed at the periphery of the array.

Then, similarly to the fifth embodiment, the first mask layer is removed, and second mask layers 46 are formed selectively on an area of 1064×808 plated layers 45 except the periphery of the array and on the plated layers 45 formed on an area corresponding to an alignment marker. The first plated layers 45 around the area of 1064×808 plated layers 45 are exposed, as illustrated in FIG. 19. Here, almost no adverse influences due to the openings for the alignment marker occurs on the current density distribution since the pattern of the openings for the alignment marker are exactly the same as that of the openings for the microlens array. Here, the second mask layer 46 on the area corresponding to the alignment marker is laid down over twenty one (21) first plated layers 45 arranged in a row in a crisscross pattern, as illustrated in FIG. 19.

Figure 20:
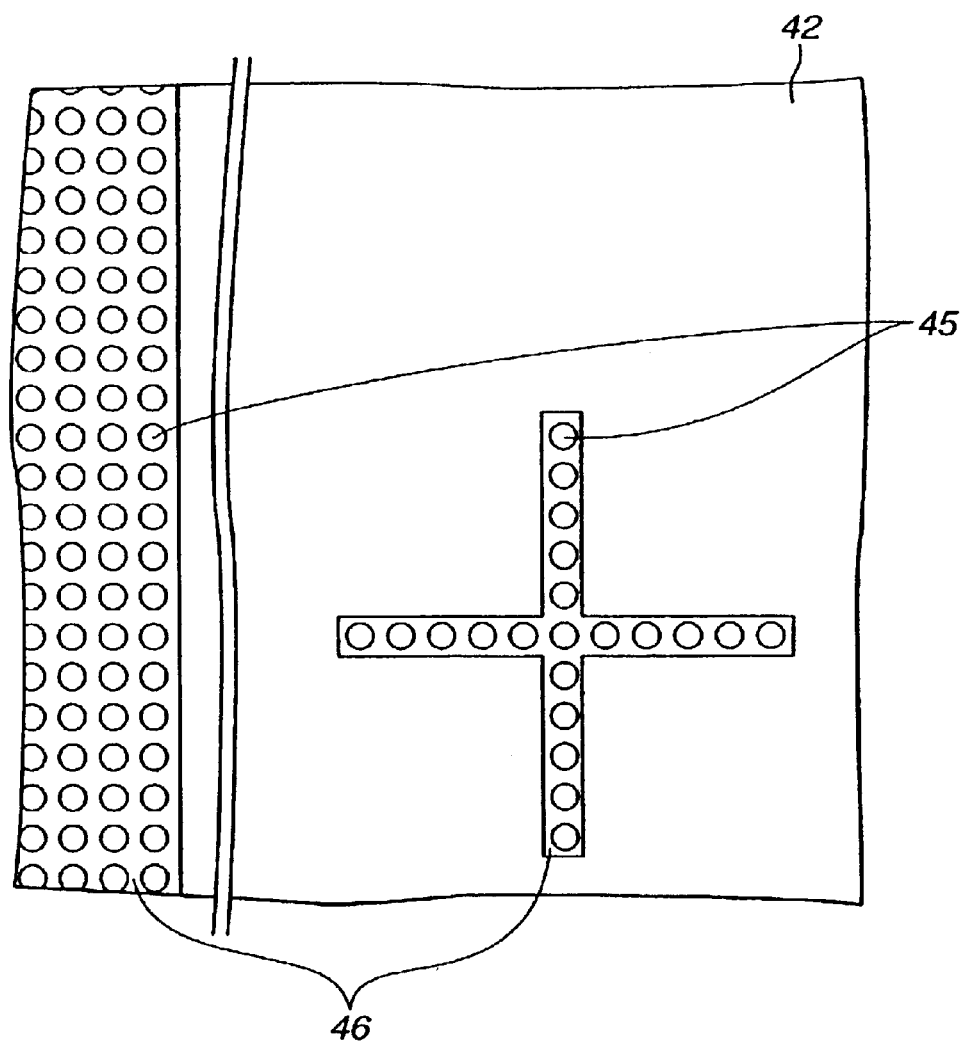
FIG. 20 is a plan view illustrating another electroplating growth step in the fabrication method of the sixth embodiment.

Electrolytic etching of the exposed first plated layers 45 is then performed, similarly to the fifth embodiment. The electrode layer 42 is not eroded since it is formed of Pt, as illustrated in FIG. 20. The electrolytic etching is stopped when the Ni plated layers 45 in the area without the second mask layer 46 are consumed.

Figure 21:
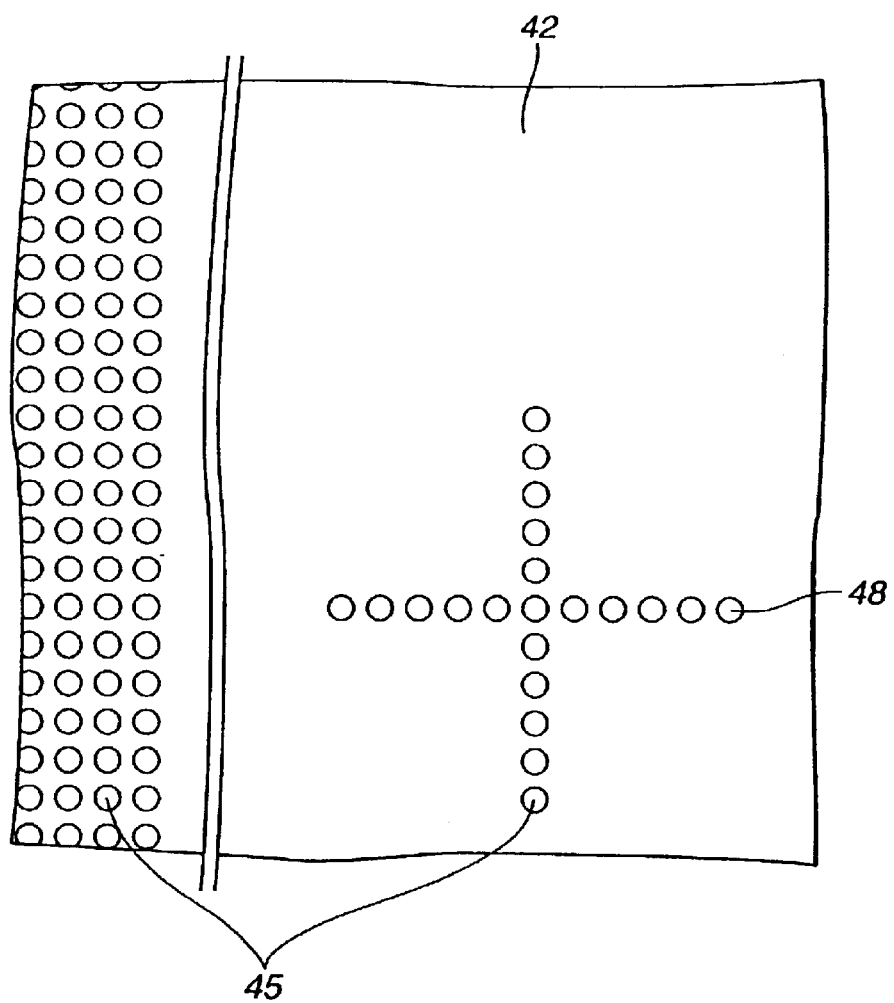
FIG. 21 is a plan view illustrating another electroplating growth step in the fabrication method of the sixth embodiment.

The second mask layer 46 is then removed, similarly to the fifth embodiment. Thus, the array of 1064×808 first plated layers 45 and a crisscross alignment marker 48 are formed, as illustrated in FIG. 21. The radius distribution of the first plated layers 45 is within 5%.

Figure 22:
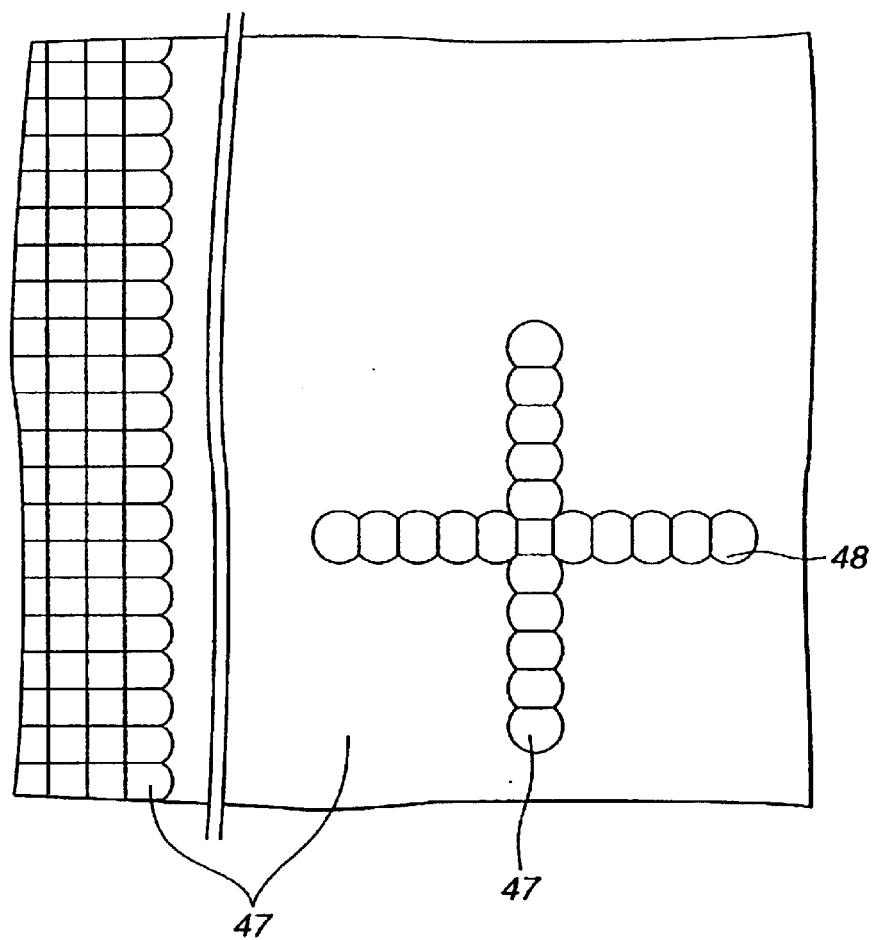
FIG. 22 is a plan view illustrating another electroplating growth step in the fabrication method of the sixth embodiment.

Ni electroless plating is then performed, similarly to the fifth embodiment. The first plated layers 45 are firmly fixed to the electrode layer 42 by a second plated layer 47, as illustrated in FIG. 22. Radii of curvature of each plated layer are approximately equal in its diagonal and horizontal directions, and the average radius of curvature is 20 μm. A distribution or variation of the radius of curvature is within ±1 μm, and a mold with a uniform profile of the plated layer can be produced. Further, a height distribution of the plated layers for microlenses and the plated layers for the alignment marker is within 5%.

Figure 28:
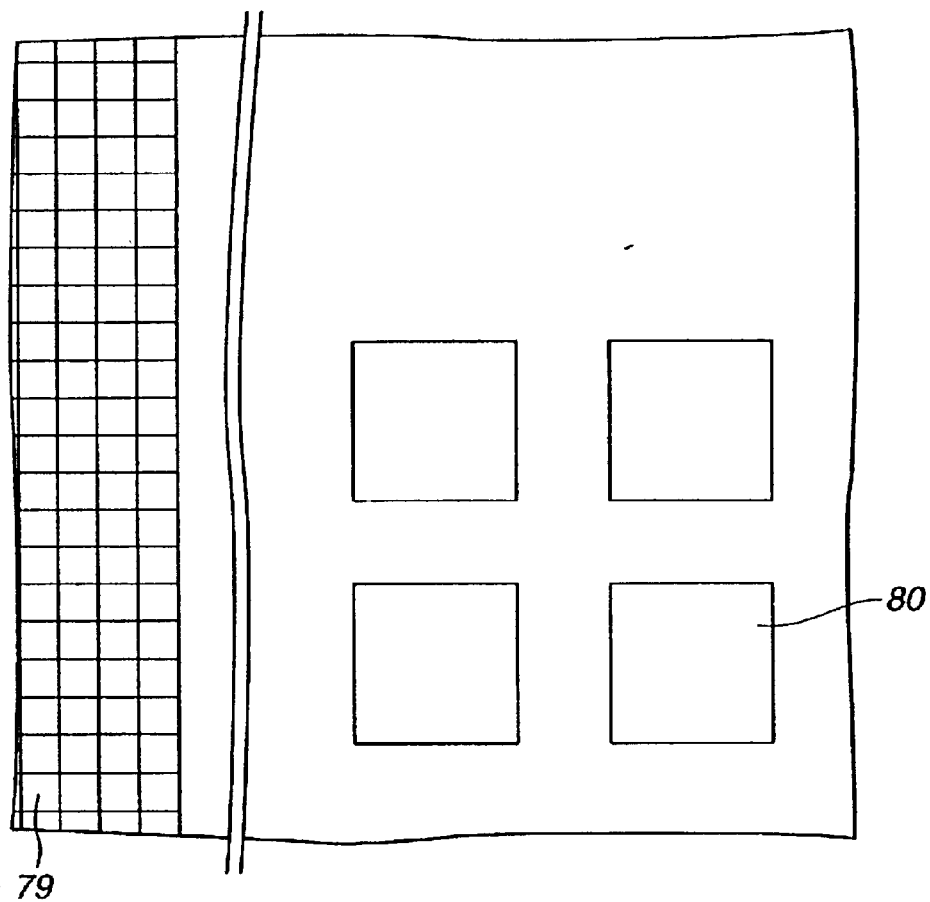
FIG. 28 is a plan view illustrating an alignment marker on a driver substrate suitable for the sixth embodiment.

As described above, in this embodiment, the distribution of microlenses can be readily reduced, and the alignment marker 48 for a precise alignment can be readily formed in a mold for a microlens array. This crisscross alignment marker 48 can be precisely aligned with an alignment marker 80 formed on a driver substrate with pixels 79 as illustrated in FIG. 28.

The above structure can also be used as a mold master. A convex microlens array can be thus fabricated. This microlens array is provided with a crisscross alignment marker for a precise alignment, and the distribution of the lens diameter is within 5%.

A seventh embodiment of the present invention will be described with reference to FIGS. 23 to 26. In the seventh embodiment also, a silicon wafer with a diameter of four inches is thermally oxidized using an oxidizing gas, and layers of silicon dioxide with a thickness of 1 μm are formed on opposite surfaces of the wafer. This wafer is processed similarly to the fifth embodiment. Thus, an electrode layer 52 is exposed in a predetermined pattern, and openings for a microlens array are formed in a first mask layer of photoresist. The opening has a circular shape with a diameter of 5 μm. Openings are arranged in an array at common intervals of 18 μm in an area with a diameter of 95 mm.

Figure 23:
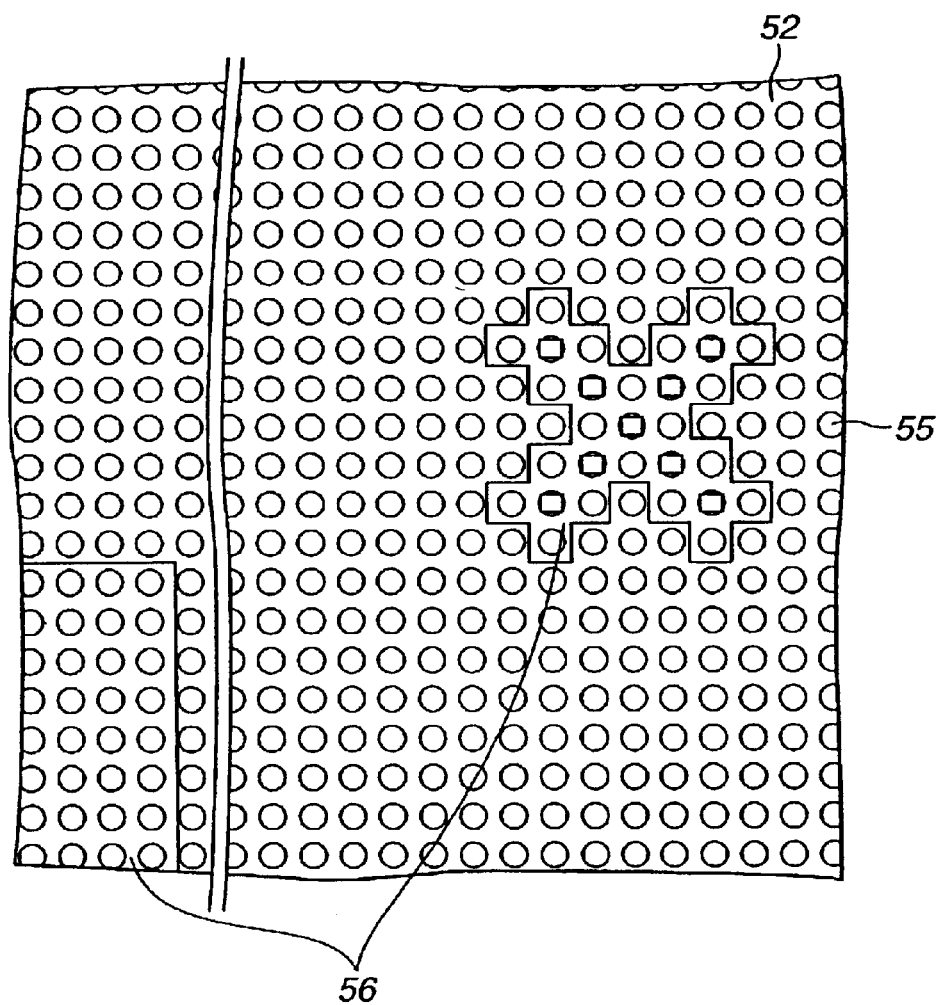
FIG. 23 is a plan view illustrating an electroplating growth step in a fabrication method of a mold for forming a microlens array of a seventh embodiment according to the present invention.

Ni electroplating is then performed similarly to the fifth embodiment. The electroplating is conducted at the bath temperature of 50° C. and the cathode current density of 40 A/dm$^2$. Similarly to the fifth embodiment, a first plated layer 55 is deposited until its radius reaches about 10 μm, as illustrated in FIG. 23. Here, when the radius of the first plated layer 55 is about 10 μm in a central portion of the array, the first plated layer 55 with the maximum radius of about 15 μm is formed at the periphery of the array.

Then, similarly to the fifth embodiment, the first mask layer is removed, and second mask layers 56 are formed selectively on an area of 1064×808 plated layers 55 except the periphery of the array and on the plated layers 55 formed on an area corresponding to an alignment marker. The first plated layers 55 around the area of 1064×808 plated layers 55 are exposed, as illustrated in FIG. 23. Here, almost no adverse influences due to the openings for the alignment marker occurs on the current density distribution since the pattern of the openings for the alignment marker are exactly the same as that of the openings for the microlenses. Here, the second mask layer 56 on the area corresponding to the alignment marker is laid down over twenty (20) first plated layers 55 arranged in two rows in a diagonal crisscross pattern, as illustrated in FIG. 23. Therefore, portions of the second mask layer 56 corresponding to the first plated layers 55 arranged in a row in a diagonal crisscross pattern are opened.

Figure 24:
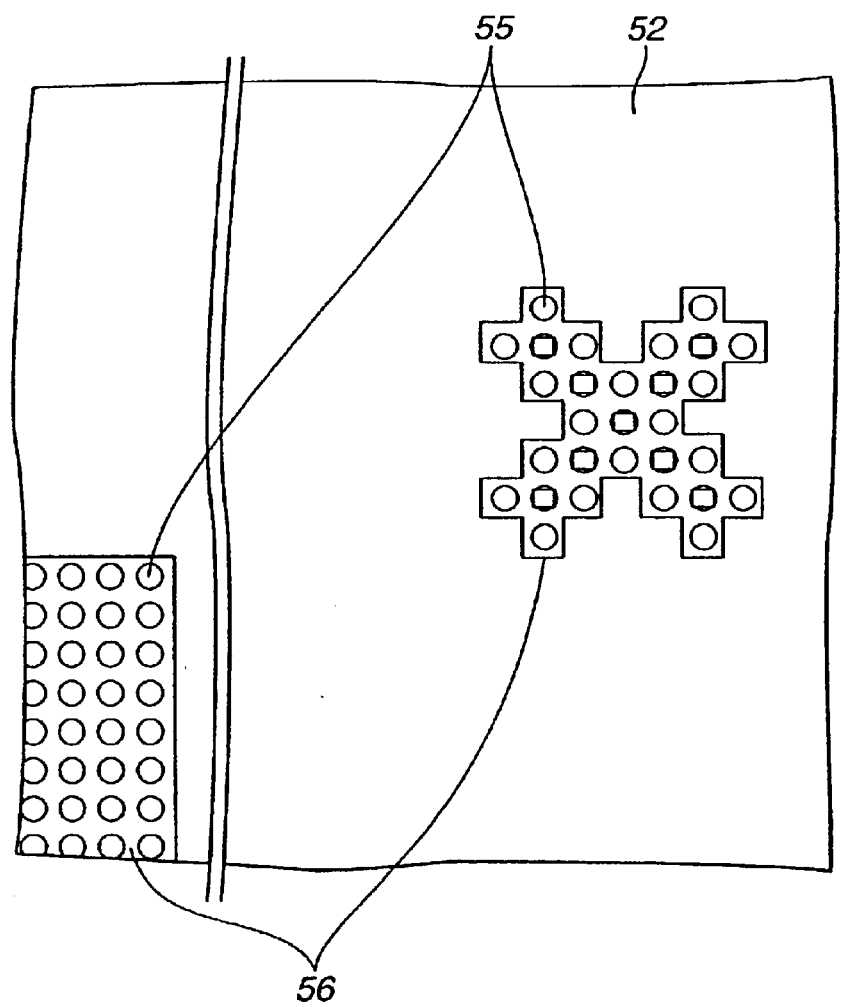
FIG. 24 is a plan view illustrating another electroplating growth step in the fabrication method of the seventh embodiment.

Electrolytic etching of the exposed first plated layers 55 is then performed, similarly to the fifth embodiment. The electrode layer 52 is not corroded since it is formed of Pt, as illustrated in FIG. 24. The electrolytic etching is stopped when the Ni plated layers 55 in the area without the second mask layer 56 are consumed.

Figure 25:
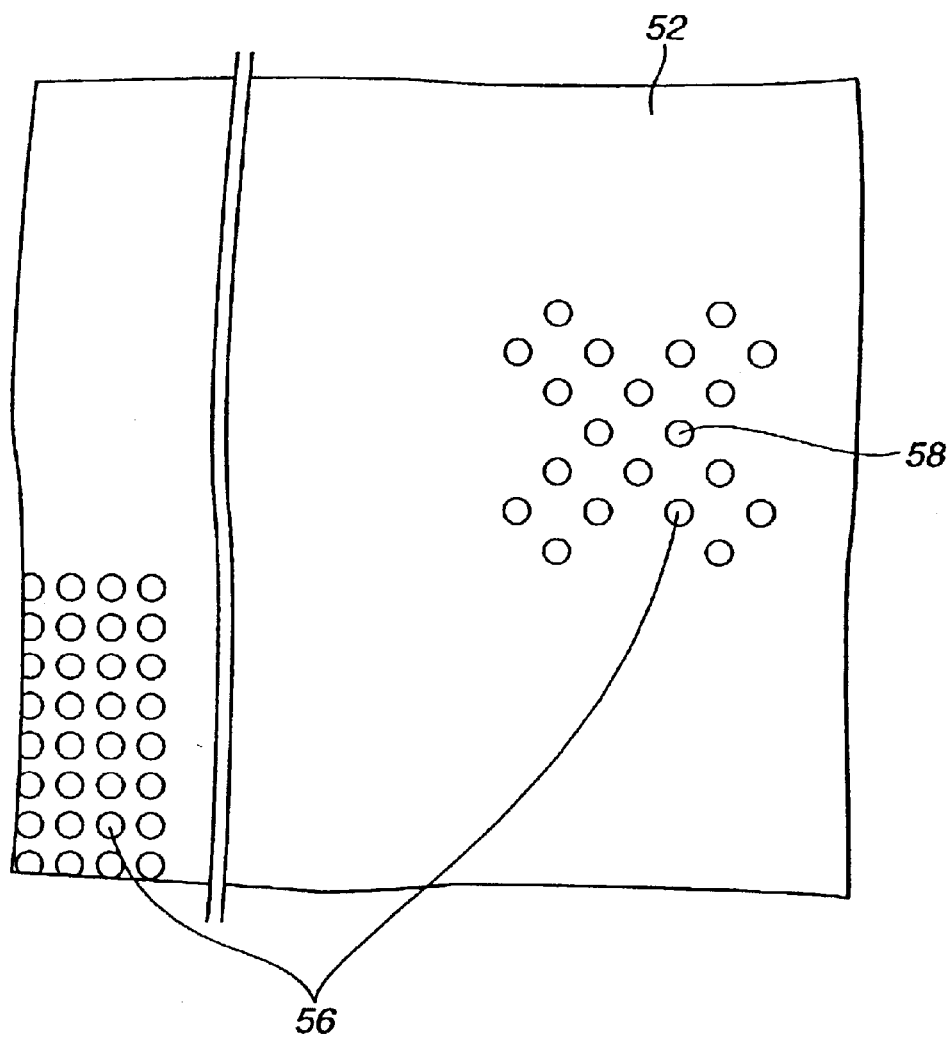
FIG. 25 is a plan view illustrating another electroplating growth step in the fabrication method of the seventh embodiment.

The second mask layer 56 is then removed, similarly to the fifth embodiment. Thus, the array of 1064×808 first plated layers 55 and a two-row diagonal crisscross alignment marker 58 are formed, as illustrated in FIG. 25. The radius distribution of the first plated layer 55 is within 5%.

Figure 26:
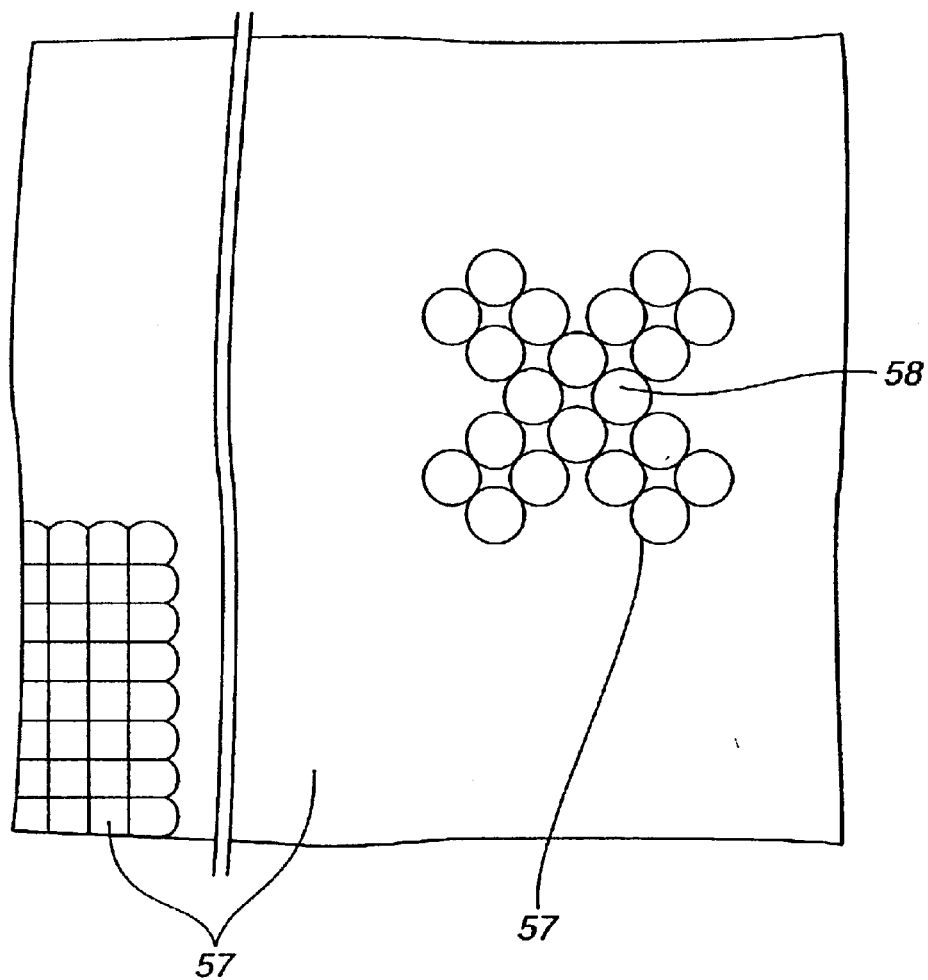
FIG. 26 is a plan view illustrating another electroplating growth step in the fabrication method of the seventh embodiment.

Ni electroless plating is then performed, similarly to the fifth embodiment. The first plated layers 55 are firmly fixed to the electrode layer by a second plated layer 57, as illustrated in FIG. 26. Radii of curvature of each plated layer are approximately equal in its diagonal and horizontal directions, and the average radius of curvature is 20 μm. A distribution or variation of the radius of curvature is within ±1 μm, and a mold with a uniform profile of the plated layer can be produced. Further, a height distribution of the plated layers for microlenses and the plated layers for the alignment marker is within 5%.

Figure 29:
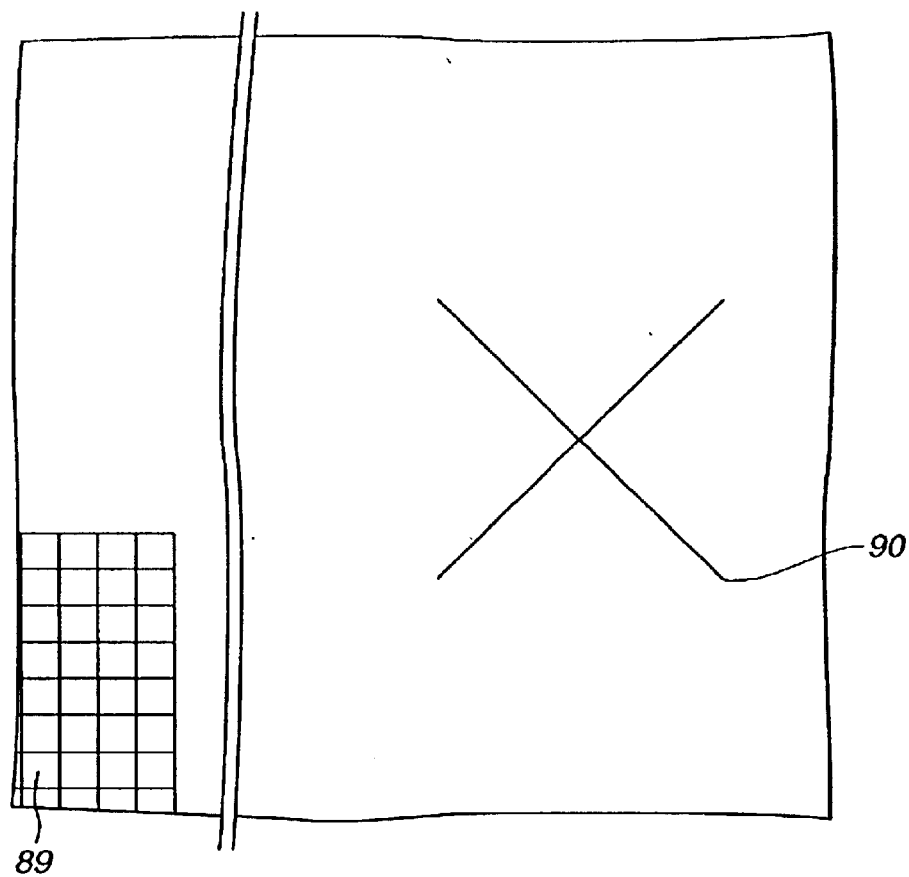
FIG. 29 is a plan view illustrating an alignment marker on a driver substrate suitable for the seventh embodiment.

As described above, also in this embodiment, the radius distribution of microlenses can be readily reduced, and the alignment marker 58 for a precise alignment can be readily formed in a mold for a microlens array. This crisscross alignment marker 58 can be precisely aligned with a diagonal crisscross alignment marker 90 formed on a driver substrate with pixels 89 as illustrated in FIG. 29.

The above structure can also be used as a mold master. A convex microlens array can be thus fabricated. This microlens array is provided with the diagonal crisscross alignment marker for a precise alignment, and the distribution of the lens diameter is within 5%.

Fifth to seventh embodiments of the present invention can also be applied to the structure of the fourth embodiment illustrated in FIG. 30.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A microstructure array comprising:
   a substrate at least a portion of which is electrically conductive;
   openings of the conductive portion of said substrate formed as a cathode of electroplating;
   first plated or electrodeposited layers on said openings forming said microstructure array;
   at least a first plated or electrodeposited layer on said openings forming an alignment marker; and
   a peripheral portion of said microstructure array where first plated or electrodeposited layers are absent on said openings, except for said first plated or electrodeposited layer forming the alignment marker.

2. The microstructure array of claim 1, wherein said openings in the peripheral portion surround the alignment marker.

3. The microstructure array of claim 1, wherein the shortest distance between said opening forming the alignment marker and said openings forming said microstructure array is set at no less than the maximum pitch of said array of openings forming said microstructure array, and an area ratio of said opening forming said alignment marker relative to an area around said opening forming said alignment marker surrounded by said array of openings in said peripheral portion is set at no more than a half (½).

4. The microstructure array of claim 1, wherein only the first plated or electrodeposited layers forming said microstructure array and the alignment marker are left and the first plated or electrodeposited layers in said peripheral portion of said microstructure array are removed.

5. The microstructure array of claim 1, wherein heights of said first plated or electrodeposited layers forming said microstructure array and the alignment marker are approximately equal to each other.

6. The microstructure array of claim 1, wherein a distribution of heights of said first plated or electrodeposited layers forming said microstructure array and the alignment marker is within 5%.

7. The microstructure array of claim 1, wherein said openings for said microstructure array and said openings for said alignment marker constitute a common array of openings.

8. The microstructure array of claim 1, wherein the alignment marker is formed by an array of the first plated or electrodeposited layers arranged in a crisscross pattern or a diagonal crisscross pattern.

9. The microstructure array of claim 1, wherein a profile of said first plated or electrodeposited layer forming said microstructure array is the same as a profile of said at least a first plated or electrodeposited layer forming the alignment marker.

10. The microstructure array of claim 1, wherein said first plated or electrodeposited layer has a semispherical profile.

11. The microstructure array of claim 1, further comprising a second plated or electrodeposited layer formed over said first plated or electrodeposited layers forming said microstructure array and the alignment marker.

12. The microstructure array of claim 1, wherein said microstructure array is a mold for a microstructure array.

13. The microstructure array of claim 12, wherein said mold for a microstructure array is a mold for a microlens array.

14. The microlens array fabricated from the microstructure array of claim 13, wherein said microlens array is to be mounted on a display device or an image pick-up device by using the alignment marker.

* * * * *

UNITED STATES PATENT AND TRADEMARK OFFICE
CERTIFICATE OF CORRECTION

PATENT NO. : 6,800,950 B2
DATED : October 5, 2004
INVENTOR(S) : Takayuki Teshima et al.

It is certified that error appears in the above-identified patent and that said Letters Patent is hereby corrected as shown below:

Title page,
Item [57], ABSTRACT,
Line 3, "s" should read -- a --; and
Line 15, "oppressed" should read -- suppressed --.

Column 1,
Line 24, "semispherical" should read -- hemispherical --.

Column 3,
Lines 15 and 39, "semispherical" should read -- hemispherical --;
Line 66, "electrode posited" should read -- electrodeposited --.

Column 4,
Lines 22 and 35, "oppressed" should read -- suppressed --.

Column 5,
Line 62, "oppressed" should read -- suppressed --; and
Line 64, "semispherical" should read -- hemispherical --.

Column 6,
Line 20, "oppressed" should read -- suppressed --.

Column 7,
Line 5, "oppressed" should read -- suppressed --.

Column 8,
Line 48, "tow-dimensional" should read -- two-dimensional --.

Column 9,
Line 34, "semispherical" should read -- hemispherical --.

Column 12,
Line 36, "occurs" should read -- occur --.

Column 13,
Line 62, "the each" should read -- each --; and
Line 64, "occurs" should read -- occur --.

UNITED STATES PATENT AND TRADEMARK OFFICE
CERTIFICATE OF CORRECTION

PATENT NO. : 6,800,950 B2
DATED : October 5, 2004
INVENTOR(S) : Takayuki Teshima et al.

It is certified that error appears in the above-identified patent and that said Letters Patent is hereby corrected as shown below:

Column 15,
Line 14, "semispherical" should read -- hemispherical --.

Column 16,
Line 2, semispheri-" should read -- hemispherical --;
Line 3, "cal" should be deleted; and
Line 63, "occurs" should read -- occur --.

Column 17,
Line 67, "occurs" should read -- occur --.

Column 18,
Line 1, "are" should read -- is --.

Column 19
Line 6, "claim 1" should read -- claim 2 --.

Column 20,
Line 11, "semispherical" should read -- hemispherical --.

Signed and Sealed this

Third Day of May, 2005

JON W. DUDAS
*Director of the United States Patent and Trademark Office*